(12) United States Patent
Moriya et al.

(10) Patent No.: US 7,547,567 B2
(45) Date of Patent: Jun. 16, 2009

(54) METHOD OF FORMING FILM PATTERN, DEVICE, METHOD OF MANUFACTURING DEVICE, ELECTRO-OPTICAL DEVICE, AND ELECTRONIC APPARATUS

(75) Inventors: Katsuyuki Moriya, Azumino (JP); Toshimitsu Hirai, Chino (JP)

(73) Assignee: Seiko Epson Corporation (JP)

( * ) Notice: Subject to any disclaimer, the term of this patent is extended or adjusted under 35 U.S.C. 154(b) by 540 days.

(21) Appl. No.: 11/347,689

(22) Filed: Feb. 3, 2006

(65) Prior Publication Data

US 2006/0178014 A1 Aug. 10, 2006

(30) Foreign Application Priority Data

Feb. 4, 2005 (JP) ............... 2005-028585
Jul. 29, 2005 (JP) ............... 2005-220147

(51) Int. Cl.
*H01L 21/00* (2006.01)
(52) U.S. Cl. .................. 438/30; 438/584; 438/674; 257/E21.174
(58) Field of Classification Search ............. 438/30, 438/584, 587, 674; 257/E21.174, E21.576
See application file for complete search history.

(56) References Cited

U.S. PATENT DOCUMENTS

| | | | |
|---|---|---|---|
| 2005/0003166 A1* | 1/2005 | Hirai ................ | 428/195.1 |
| 2005/0005799 A1* | 1/2005 | Hirai ................ | 101/483 |
| 2005/0158665 A1* | 7/2005 | Maekawa et al. ........ | 430/313 |
| 2005/0191781 A1* | 9/2005 | Hirai ................ | 438/30 |
| 2006/0008713 A1* | 1/2006 | Toyoda ............... | 430/7 |
| 2006/0008930 A1* | 1/2006 | Toyoda et al. ......... | 438/22 |
| 2006/0065897 A1* | 3/2006 | Hirai et al. .......... | 257/72 |
| 2007/0085112 A1* | 4/2007 | Yamazaki et al. ...... | 257/288 |
| 2007/0148564 A1* | 6/2007 | Iketa et al. ........... | 430/7 |
| 2007/0194449 A1* | 8/2007 | Hirai ................ | 257/750 |
| 2008/0063949 A1* | 3/2008 | Inoue ................ | 430/5 |
| 2008/0074037 A1* | 3/2008 | Fukase et al. .......... | 313/504 |

FOREIGN PATENT DOCUMENTS

| | | |
|---|---|---|
| JP | 09-203803 | 8/1997 |
| JP | 2002-072502 | 3/2002 |
| JP | 2003-149831 | 5/2003 |
| JP | 2003-243355 | 8/2003 |
| JP | 2004-134446 | 4/2004 |
| JP | 2004-302088 | 10/2004 |
| JP | 2004-305989 | 11/2004 |
| JP | 2004-330165 | 11/2004 |
| JP | 2004-335962 | 11/2004 |

* cited by examiner

*Primary Examiner*—Fernando L Toledo
(74) *Attorney, Agent, or Firm*—Harness, Dickey & Pierce, P.L.C.

(57) ABSTRACT

A method of forming a film pattern by disposing functional liquid on a substrate includes: forming banks on the substrate; disposing the functional liquid in regions partitioned by the banks; and drying the functional liquid disposed on the substrate. The forming of the banks includes forming a thin film on the substrate, the thin film being made of a material for forming the banks, performing lyophobic treatment on a surface of the thin film, and patterning the thin film into the shapes of the banks.

12 Claims, 20 Drawing Sheets

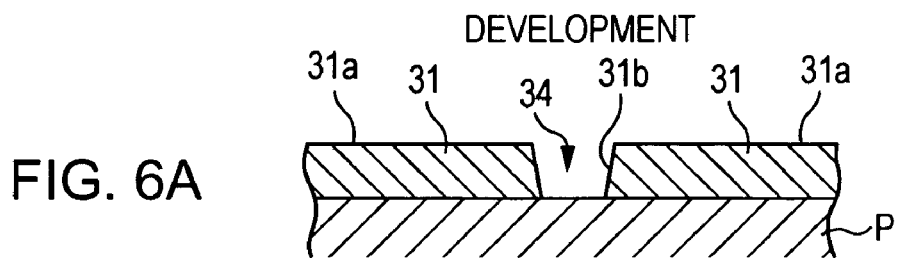
FIG. 6A DEVELOPMENT
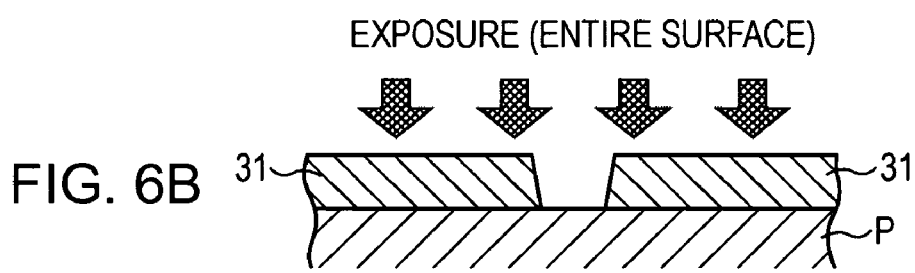
FIG. 6B EXPOSURE (ENTIRE SURFACE)
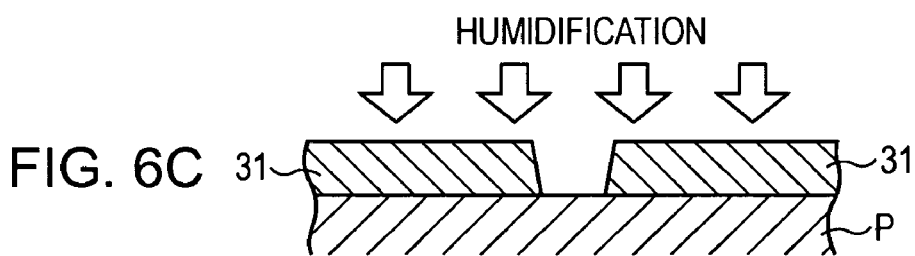
FIG. 6C HUMIDIFICATION
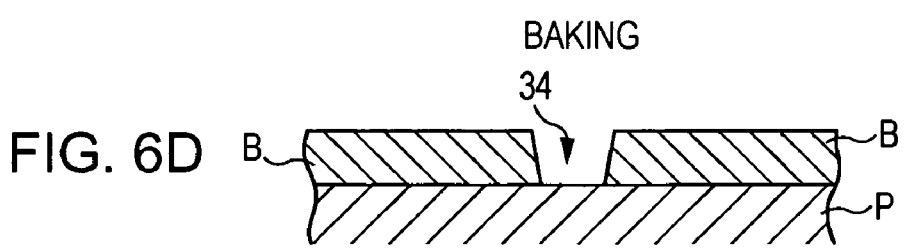
FIG. 6D BAKING
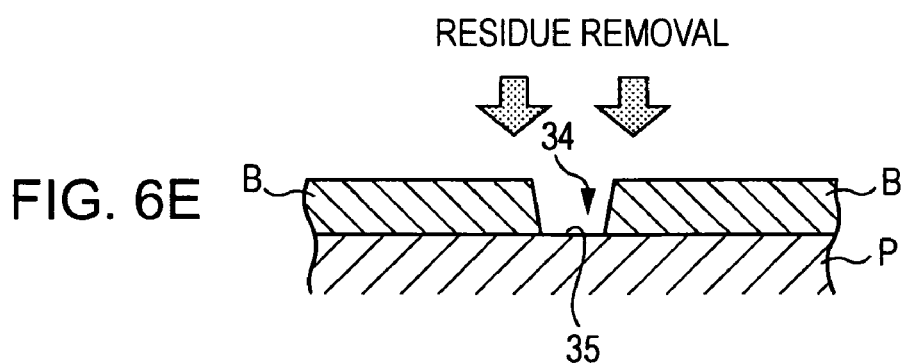
FIG. 6E RESIDUE REMOVAL

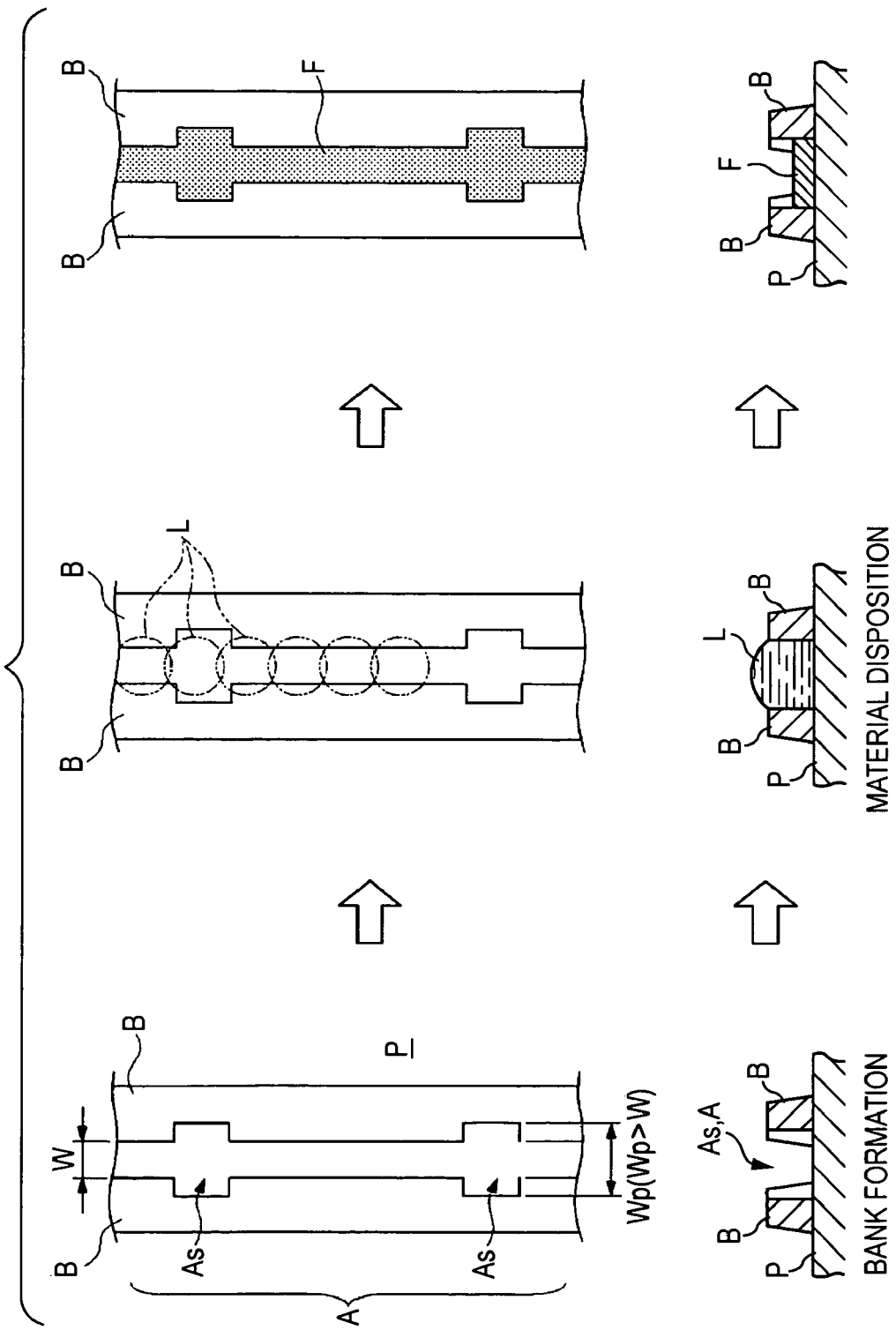

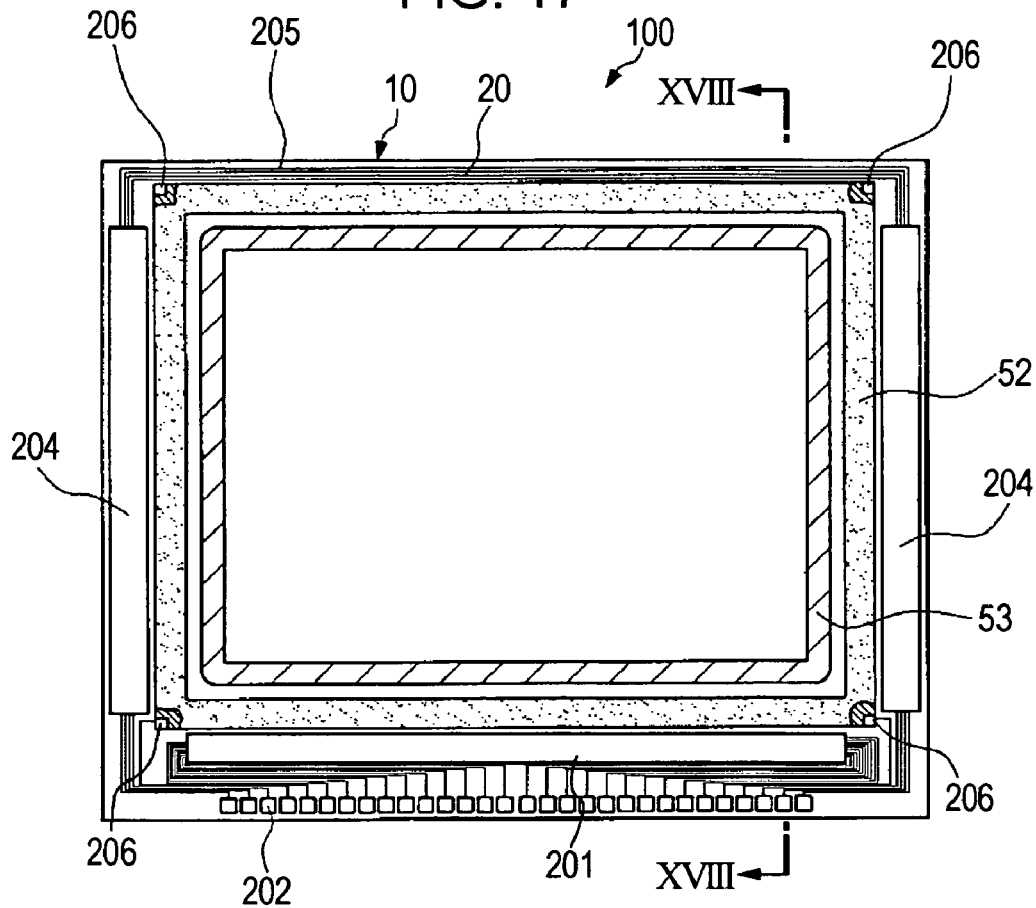
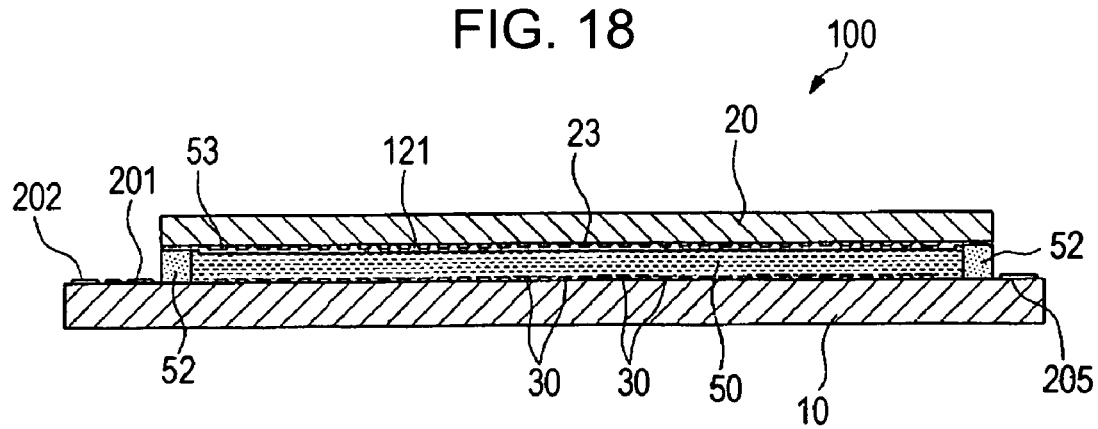

METHOD OF FORMING FILM PATTERN, DEVICE, METHOD OF MANUFACTURING DEVICE, ELECTRO-OPTICAL DEVICE, AND ELECTRONIC APPARATUS

REALTED APPLICATIONS

This application claims priority to Japanese Patent Application Nos. 2005-028585 filed Feb. 4, 2005 and 2005-220147 filed Jul. 29, 2005 which are hereby expressly incorporated by reference herein in their entirety.

BACKGROUND

1. Technical Field

The present invention relates to a method of forming a film pattern, a device, a method of manufacturing the device, an electro-optical device, and an electronic apparatus.

2. Related Art

Devices having wiring lines, such as electronic circuits or integrated circuits, are manufactured by using a photolithography method, for example. The photolithography method is used to apply a photosensitive material, which is called a resist, on a substrate on which a conductive film is applied beforehand, irradiate and develop a circuit pattern, and etch the conductive film according to a resist pattern so as to form a wiring pattern of a thin film. However, the photolithography method requires large-size equipments, such as a vacuum apparatus, or a complicated process, and only a small percentage of the materials are used, causing high production cost and waste of materials.

On the other hand, there has been suggested a method of forming a wiring pattern on a substrate by using a liquid droplet discharging method in which liquid material is discharged from a liquid droplet discharging head in the shape of liquid droplets, that is, a so-called inkjet method (for example, see JP-A-2002-72502). In this method, ink for formation of the wiring pattern, which is functional liquid in which conductive particles such as metal particles are dispersed, is directly applied on the substrate into a pattern, and is then converted into a thin conductive film pattern by performing a heat treatment and laser irradiation for the ink. Therefore, the photolithography method is not needed, which simplifies the process and requires less raw material.

When a film pattern is formed on a substrate by using the inkjet method, an embankment structure called a bank is typically formed in order to prevent the ink from spreading. The surface of the bank is subjected to a lyophobic treatment in order to prevent the ink from adhering thereto. In this case, however, since the entire bank becomes lyophobic, wettability of the ink at a side of the bank becomes deteriorated, and therefore, a problem may arise in that the ink does not permeate into the bank well. In addition, since the sides of the bank repel the ink, the film may become irregular.

SUMMARY

An advantage of some aspects of the invention is that it provides a method of forming a film pattern, which is capable of consistently forming a fine film pattern with high performance, a device, a method of manufacturing the device, an electro-optical device, and an electronic apparatus.

According to an aspect of the invention, a method of forming a film pattern by disposing functional liquid on a substrate includes: forming banks on the substrate; disposing the functional liquid in regions partitioned by the banks; and drying the functional liquid disposed on the substrate. The forming of the banks includes forming a thin film on the substrate, the thin film being made of a material for forming the banks, performing lyophobic treatment on a surface of the thin film, and patterning the thin film into the shapes of the banks.

In the method of forming the film pattern according to the aspect of the invention, the functional liquid is disposed in the regions partitioned by the banks, and the film pattern is formed on the substrate by drying the functional liquid. In this case, since the shape of the film pattern is defined by the banks, the film pattern can be made to be thin or fine by properly forming the banks, for example, by narrowing the width between adjacent banks. In addition, in the method, since the banks are subjected to the lyophobic treatment before being patterned, only upper surfaces of the banks are subjected to the lyophobic treatment, and lateral surfaces of the banks are not subjected to the lyophobic treatment. Accordingly, even when a fine pattern is formed, the functional liquid can be smoothly permeated into the banks, thus improving regularity of the film.

In the invention, preferably, the forming of the banks includes forming the thin film on the substrate, the thin film being made of the material for forming the banks, performing exposure treatment on the thin film, performing the lyophobic treatment on the surface of the thin film, and patterning the thin film into the shapes of the banks.

According to the method, for example, when a photosensitive material is used as the bank formation material, by exposing and patterning the thin film made of the bank formation material, a process of applying and peeling off a photosensitive resist can be omitted. Accordingly, the film pattern can be manufactured with high productivity.

Further, in the invention, it is preferable that the bank formation material contain one of polysilazane, polysilane, and polysiloxane. Since the bank formation material includes an inorganic material containing one of polysilazane, polysilane, and polysiloxane, the banks have high heat-resistance, and the difference in the coefficients of thermal expansion between the banks and the substrate becomes small. Accordingly, the banks are prevented from being deteriorated due to the heat generated when the functional liquid is dried, thus obtaining a good film pattern. In addition, even when the substrate is baked at a temperature higher than a temperature at which the functional liquid is dried, for example, when the baking process is performed to form the banks, when the film is baked after the functional liquid has dried, or when other portions on the substrate are baked in subsequent processes, the banks can be prevented from being deteriorated, and thus the processes described above can be consistently performed. As a result, according to the method, the film pattern can be consistently formed with high precision.

In addition, since the bank formation material includes an inorganic material containing one of polysilazane, polysilane, and polysiloxane, the banks can be composed of a high molecular material having a siloxane skeleton after being baked. Since the high molecular material having the siloxane skeleton has high heat-resistance and the difference in the coefficients of thermal expansion between the high molecules and the substrate is small, as long as a material composed of high molecules having a siloxane skeleton after being baked is used, the same effect as polysilazane, polysilane, and polysiloxane can be obtained as the bank formation material.

Furthermore, in the invention, it is preferable that the material for forming the banks be a photosensitive material containing one of polysilazane, polysilane, and polysiloxane.

By using the photosensitive material, the banks can be easily patterned.

Furthermore, in the invention, it is preferable that the functional liquid be disposed in the regions by using a liquid droplet discharging method.

According to the method, by using the liquid droplet discharging method, the consumption of liquid materials can be reduced and it becomes easy to control the amount or position of the functional liquid disposed on the substrate, as compared to other application methods such as a spin coat method.

Furthermore, in the invention, it is preferable that each of the regions partitioned by the banks be partially widened. Specifically, each of the regions includes a wide region having a width larger than a flight diameter of the functional liquid and a narrow region having a width smaller than the width of the wide region.

According to this method, the film pattern can be made to be thin or fine by properly forming the banks, for example, by narrowing the width between adjacent banks (the width of the narrow region). In this case, it is preferable that the lateral surfaces of the banks have high wettability, but since the lateral surfaces of the banks do not become lyophobic in this method, even when the width between the banks is small, the functional liquid can be smoothly introduced into the banks according to a capillary phenomenon.

In addition, in the method, since each of the regions partitioned by the banks is partially widened, some of the functional liquid is evacuated into the wide portion when the functional liquid is disposed, thus preventing the functional liquid from overflowing the banks. As a result, the film pattern can be precisely formed in a desired shape.

According to another aspect of the invention, a method of manufacturing a device having a film pattern formed on a substrate includes forming the film pattern on the substrate by using the method of forming the film pattern described above.

In the method of manufacturing the device, the film pattern formed in the device can be consistently made to be thin or fine. As a result, a device having high density can be consistently manufactured.

In particular, when the film pattern forms a portion of a switching element, such as a TFT provided on the substrate, a highly integrated switching element can be securely obtained.

Further, when the film pattern forms at least a portion of at least one of a gate electrode of the switching element, such as a TFT provided on the substrate, and a gate wiring line connected to the gate electrode, a gate electrode of a highly integrated element can be consistently obtained while a gate wiring line transmitting a signal between elements can be consistently obtained.

According to yet another aspect of the invention, a device manufactured by using the method of manufacturing the device is provided.

Further, according to yet another aspect of the invention, an electro-optical device includes the device. Furthermore, according to yet another aspect of the invention, an electronic apparatus includes the electro-optical device.

Thereby, high-performance devices, electro-optical devices, and electronic apparatuses can be provided.

In addition, the electro-optical device includes a liquid crystal display device, an organic EL display device, a plasma display panel, etc.

BRIEF DESCRIPTION OF THE DRAWINGS

The invention will be described with reference to the accompanying drawings, wherein like numbers reference like elements.

FIGS. 6A to 6E are process views subsequent to FIGS. 5A to 5E.

FIG. 10 is a process view illustrating a method of forming a film pattern according to a third embodiment of the invention.

FIG. 17 is a plan view illustrating a liquid crystal display device when viewed from a counter substrate side.

FIG. 18 is a cross-sectional view taken along the line XVIII-XVIII of FIG. 17.

DESCRIPTION OF EXEMPLARY EMBODIMENTS

Hereinafter, exemplary embodiments of the invention will be described with reference to the accompanying drawings.

Figure 1:
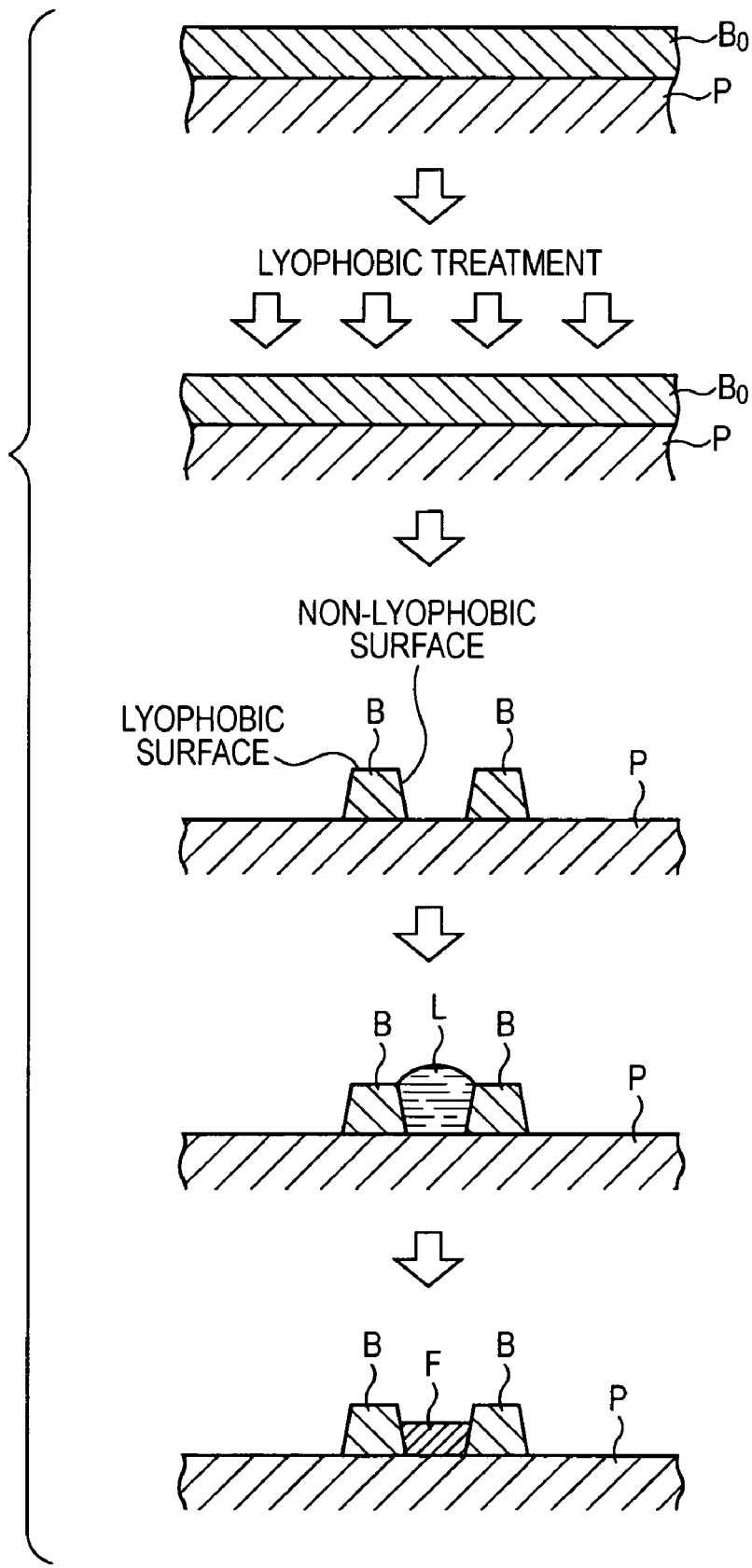
FIG. 1 is a view conceptually illustrating a method of forming a film pattern according to the invention.

FIG. 1 is a view conceptually illustrating a method of forming a film pattern according to the invention.

According to the invention, a method of forming a film pattern includes a thin film forming process of forming a thin film $B_0$, which is made of a material for forming banks B, on a substrate P, a lyophobic treatment process of performing lyophobic treatment for a surface of the thin film $B_0$, a patterning process of patterning the thin film $B_0$ into a shape of the banks B (the above-mentioned processes are collectively referred to as a 'bank forming process'), a material disposition process of disposing functional liquid L on regions partitioned by the banks B, and a drying (baking) process of drying the functional liquid L disposed on the substrate P.

In the method of forming a film pattern according to the invention, the functional liquid L is disposed on the regions partitioned by the banks B and a film pattern F is formed on the substrate P by drying the functional liquid L. In this case, since the shape of the film pattern F is defined by the banks B, the film pattern F can be made fine or thin by properly forming the banks B, for example, by narrowing the width between adjacent banks B. In addition, after the film pattern F is formed, the banks B may be removed from the substrate P or may be left on the substrate P.

Further, in the method of forming a film pattern according to the invention, the formation material of the banks B may be either organic materials (high molecular materials such as acryl resin, polyimide resin, olefin resin, or melamine resin) or inorganic materials. From the point of view of the heat-resistance, the inorganic materials are preferably used. When the formation material of the banks B includes the inorganic materials, since the heat-resistance of the banks B becomes high and the difference in the coefficients of thermal expansion between the banks B and the substrate P becomes small, the banks B may be prevented from being deteriorated due to heat being generated when the functional liquid is dried or baked, and thus the film pattern F has a desired shape. For example, when the functional liquid L is baked, for example, when low-melting-point glass and the like are applied beforehand on the banks B and the functional liquid, or when a baking process is performed to remove or sinter a coating material of particles, a baking temperature may be a high temperature more than 300° C. Even in this case, since the banks B are formed of the inorganic material, sufficient durability of the banks B can be obtained.

The inorganic material of the banks B may include, for example, high molecular inorganic materials or photosensitive inorganic materials containing silicon with a skeleton of polysilazane, polysilane, polysiloxane, siloxane resist, or polysilane resist, a spin-on-glass film containing one of silica glass, alkylsiloxane polymer, alkylsilsequioxane polymer, alkylsilsequioxane polymer hydride and polyaryl ether, a diamond film, an amorphous carbon fluoride film, etc. In addition, the inorganic material of the banks B may include, for example, aerogel, porous silica, etc.

The above-mentioned inorganic material for bank formation is used as the starting material before performing a baking process for forming the banks B, and solid components of dispersion solution preferably contains one of polysilazane, polysilane and polysiloxane.

when the banks B are formed, first, a layer (thin film $B_0$) made of bank formation material is formed on the substrate P by using various coat methods or a CVD (chemical vapor deposition) method. Thereafter, a surface of the thin film $B_0$ is subjected to a lyophobic treatment and is then patterned by etching and the like so as to obtain the banks B having a predetermined shape. By performing the lyophobic treatment before a development treatment, a contact angle can be prevented from being reduced over time due to contamination of stored organic matter. Alternatively, the same effect can be obtained by forming the thin film $B_0$, which is made of photosensitive bank formation material, on the substrate P by using various coat methods, performing the lyophobic treatment for the surface of the thin film $B_0$, and then patterning the surface into the bank shape by using exposure and development treatments. In this case, by performing the lyophobic treatment before the exposure treatment, the process from the exposure treatment to the development treatment can be performed in a short time and a stable pattern can be obtained. Then, by baking the patterned banks, polysilazane, polysilane, and polysiloxane become high molecular materials having a siloxane skeleton.

Even though FIG. 1 shows a single layer of the banks B, the banks B may be configured to have two or more layers, for example, one being an inorganic layer and the other being an organic layer. Even in this case, the uppermost bank layer is subjected to the lyophobic treatment and is then patterned.

When the banks are subjected to the lyophobic treatment and are patterned as described above, only upper surfaces (lyophobic surfaces) of the banks are subjected to the lyophobic treatment, and lateral surfaces (non-lyophobic surfaces) of the banks are not subjected to the lyophobic treatment. Accordingly, even when a fine pattern is formed, the functional liquid can smoothly permeate into the banks, thus preventing disconnection of wires in the film pattern. In addition, since the lateral surfaces of the banks B do not repel the functional liquid L, regularity of the film can be improved.

In addition, a HMDS treatment, as a surface reforming treatment before the bank material is applied, may be performed on the substrate P. The HMDS treatment is a method of applying hexamethyldisilazane (($CH_3$)$_3$SiNHSi($CH_3$)$_3$) in vapor. Thereby, a HMDS layer, as an adhesion layer to improve the adhesion between the banks and the substrate P, can be formed on the surface of the substrate P.

The substrate P includes, for example, a glass, a quartz glass, a Si wafer, a plastic film, a metal plate. In addition, the substrate P includes a glass, a quartz glass, a Si wafer, a plastic film, or a metal plate, on which a semiconductor film, a metal film, a dielectric film, or an organic film is formed as a base layer.

In the invention, various kinds of functional liquid (ink) L may be used. The functional liquid refers to solution capable of forming a film (functional film) having a specific function by making film components contained in liquid formed as a film. As the function, there are various functions such as electrical and electronic functions (conductivity, insulation, piezoelectricity, superconductivity, dielectricity, etc.), an optical function (photoselective absorption, reflectivity, polarization, photoselective transmittivity, non-linear optical property, luminescence such as fluorescence or phosphorescence, photochromic property, etc), a magnetic function (hard magnetism, soft magnetism, non-magnetism, magnetic permeability, etc), a chemical function (adsorption, desorption, catalyst, absorption, ion conductivity, oxidation-reduction, electro-chemical property, electrochromic property, etc), a mechanical function (abrasion resistance, etc), a thermal function (thermal conductivity, thermal isolation, infrared radioactivity, etc), a biological function (bio-compatibility, anti-thrombosis, etc). In the present embodiment, a wiring pattern ink containing, for example, conductive particles is used.

A method of disposing the functional liquid L on the regions partitioned by the banks B preferably uses the liquid droplet discharging method, that is, a so-called inkjet method. The liquid droplet discharging method is advantageous in that a wasted amount of liquid material is small and the amount or position of functional liquid can be easily disposed on a substrate, as compared with other application techniques such as a spin coat method.

The wiring pattern ink is composed of dispersion solution in which conductive particles are dispersed as the dispersion medium.

The conductive particles include, for example, metal particles containing one of gold, silver, copper, palladium and nickel, oxides thereof, particles of conductive polymer or superconductor, etc.

These conductive particles may be coated with organic materials to improve dispersibility. A coating material coated on surfaces of the conductive particles may include, for example, organic solvent such as xylene or toluene, or citric acid, or the like.

The diameters of the conductive particles are preferably in the range of 1 nm to 0.1 µm. If the diameters of the conductive particles are more than 0.1 µm, there is a possibility that nozzles of liquid discharging heads will be blocked, which will be described later. Also, if the diameters of the conductive particles are less than 1 nm, the volume ratio of the coating material to the conductive particles becomes large, resulting in a large amount of organic matter in an obtained film.

A preferable dispersion medium is one that can disperse the conductive particles without blockage. For example, the dispersion medium may include water, alcohols such as methanol, ethanol, propanol, butanol, hydrocarbon compounds such as n-heptane, n-octane, decane, dodecane, tetradecane, toluene, xylene, cymene, durene, indene, dipentene, tetrahydronaphthalene, decahydronaphthalene, cyclohexylbenzene, etc., ether compounds such as ethylene glycol dimethyl ether, ethylene glycol diethyl ether, ethylene glycol methylethyl ether, diethylene glycol dimethyl ether, diethylene glycol diethyl ether, diethylene glycol methylethyl ether, 1,2-dimethoxyethane, bis (2-methoxyethyl)ether, p-dioxane, etc., polar compounds such as propylene carbonate, γ-butyrolactone, N-methyl-2-pyrrolidone,dimethyformamide, dimethylsulfoxide, cyclohexanone, etc. Of these compounds, from the view point of the dispersibility of particles and the stability of dispersion solution and applicability of the compounds to the liquid droplet discharging method (inkjet method), the dispersion medium is preferably water, alcohol, hydrocarbon compounds, and ether compounds, more preferably, water and hydrocarbon compounds.

A surface tension of the dispersion solution of the conductive particles is preferably within a range of 0.02 N/m to 0.07 N/m. When liquid is discharged by using the liquid droplet discharging method, if the surface tension is less than 0.02 N/m, flight irregularity may easily occur because the wettability of the ink composition with respect to nozzle surfaces increases. In contrast, if the surface tension is more than 0.07 N/m, it is difficult to control the amount of discharge or discharge timing due to the irregular shapes of the meniscus at the leading edge of the nozzle. In order to adjust the surface tension, it is preferable to add a very small amount of fluorine, silicon, or non-ionic surface tension conditioning agent within a range such that the contact angle of the dispersion solution of the substrate is not significantly lowered. The non-ionic surface tension conditioning agent assists to improve regularity of a film and prevent fine irregularity of the film from occurring by improving the wettability of the liquid on the substrate. The surface tension conditioning agent may contain organic compounds such as alcohol, ether, ester, or ketone, if necessary.

The viscosity of the dispersion solution is preferably in the range of 1 to 50 mPa·s. When liquid droplet material is discharged as liquid droplets by using the liquid droplet discharging method, if the viscosity of the dispersion solution is less than 1 mPa·s, the circumferences of the nozzles may be easily contaminated due to outflow of the ink. In contrast, if the viscosity of the dispersion solution is more than 50 mPa·s, the blockage frequency of nozzle holes become high, as a result, becoming difficult in smoothly discharging the liquid droplets.

A discharge technique of the liquid droplet discharging method may include a charging control system, a pressure vibration system, an electric-mechanical conversion system, an electric-thermal conversion system, an electrostatic suction system, etc. The charging control system is to provide charge to material by using charging electrodes and to control the flight direction of the material by using deflecting electrodes so as to discharge the material from the nozzles. In addition, the pressure vibration system is to apply very high pressure of about 30 kg/cm$^2$ to material so as to discharge the material toward leading edges of the nozzles. In this case, when a control voltage is not applied, the material goes straight to be discharged from the nozzles. If the control voltage is applied, an electrostatic repulsive force between materials is produced, and accordingly, the materials are scattered and are not discharged from the nozzles. In addition, the electric-mechanical conversion system, which uses a property that piezoelectric elements are deformed when an electric pulse signal is applied thereto, is to apply a pressure to a space, in which materials are stored, through a flexible material by deforming the piezoelectric elements, and to press the materials out of the space so as to discharge the materials from the nozzles.

In addition, the electric-thermal conversion system is to produce bubbles by rapidly vaporizing materials using a heater provided in the space in which the materials are stored, and to discharge the materials stored in the space by using pressure of the bubbles. The electrostatic suction system is to apply a small pressure to the space in which materials are stored so as to form meniscus of materials on nozzles, and to extract the materials by applying an electrostatic attraction force. In addition to the above-mentioned systems, techniques, such as a system where the change of viscosity of fluid due to an electric field is used and a system where discharged spark is used, can also be applied. The liquid droplet method is advantageous in that it is possible to reduce the wasted amount of materials and to dispose a desired amount of materials at a desired position. In addition, one droplet of a liquid material (fluid) discharged according to the liquid droplet discharging method has a weight in the range of, for example, 1 to 300 nanograms.

In the method of forming the film pattern according to the invention, the conductive film pattern can be formed by using the above-described wiring pattern ink. The conductive film pattern is applied, as wiring lines, to various devices.

Figure 2:
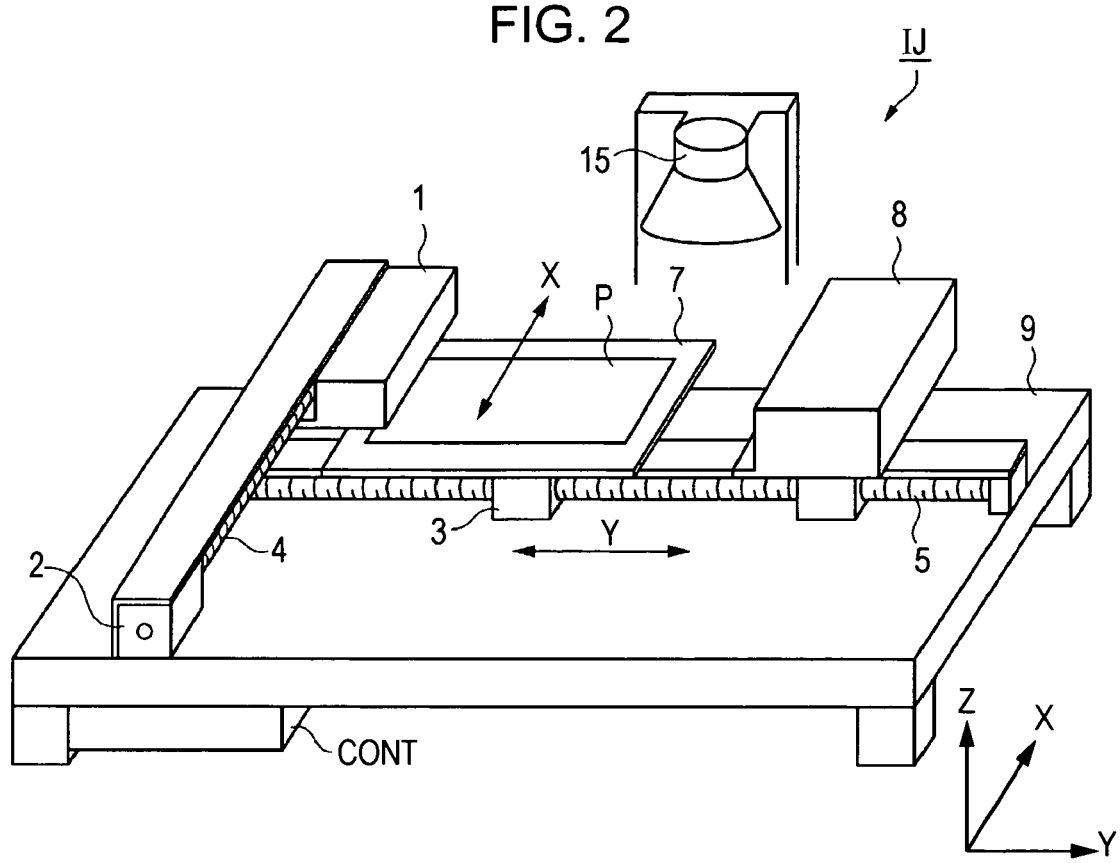
FIG. 2 is a perspective view schematically illustrating a liquid droplet discharging apparatus.

FIG. 2 is a perspective view schematically illustrating the construction of a liquid droplet discharging apparatus (inkjet apparatus) IJ in which a liquid material is disposed on a substrate by using the liquid droplet discharging method, as an example of an apparatus used in the method of forming the film pattern according the invention.

The liquid droplet discharging apparatus IJ includes a liquid droplet discharging head 1, an X axis direction driving shaft 4, a Y axis direction guide shaft 5, a controller CONT, a stage 7, a cleaning mechanism 8, a base station 9, and a heater 15.

The stage 7 supports a substrate P on which ink (liquid material) is provided by the liquid droplet discharging apparatus IJ, and includes a fixture (not shown) for fixing the substrate P at a reference position.

The liquid droplet discharging head 1 is a multi-nozzle-type liquid droplet discharging head having a plurality of discharging nozzles and a long side thereof lies in the Y axis direction. The plurality of discharging nozzles is positioned in a row on a lower side of the liquid droplet discharging head 1 at predetermined intervals in the Y direction. The ink containing the above-described conductive particles is discharged onto the substrate P supported on the stage 7 from the discharging nozzles of the liquid droplet discharging head 1.

An X axis direction driving motor 2 is connected to the X axis direction driving shaft 4. The X axis direction driving motor 2 is, for example, a stepping motor and rotates the X axis direction driving shaft 4 when an X axis direction driving signal is supplied from the controller CONT. When the X axis direction driving shaft 4 is rotated, the liquid droplet discharging head 1 moves in the X axis direction.

The Y axis direction guide shaft 5 is fixed not to move with respect to the base station 9. The stage 7 includes a Y axis direction driving motor 3. The Y axis direction driving motor 3 is, for example, a stepping motor and moves the stage 7 in the Y axis direction when a Y axis direction driving signal is supplied from the controller CONT.

The controller CONT supplies a voltage to control the amount of discharge of the liquid droplets to the liquid droplet discharging head 1. In addition, the controller CONT supplies a driving pulse signal, which controls the movement of the liquid droplet discharging head 1 in the X axis direction, to the X axis direction driving motor 2 and a driving pulse signal, which controls the movement of the stage 7 in the Y axis direction, to the Y axis direction driving motor 3.

The cleaning mechanism 8 cleans the liquid droplet discharging heat 1. The cleaning mechanism 8 includes a Y axis direction driving motor (not shown). The cleaning mechanism 8 moves along the Y axis direction guide shaft 5 by driving the Y axis direction driving motor. The movement of the cleaning mechanism 8 is controlled by the controller CONT.

The heater 15 is to thermally treat the substrate P by using a lamp annealing, for example, and vaporizes and dries the solvent contained in the liquid material applied on the substrate P. The power on/off of the heater 15 is controlled by the controller CONT.

The liquid droplet discharging apparatus IJ discharges liquid droplets onto the substrate P while relatively scanning the stage 7 supporting the liquid droplet discharging head 1 and the substrate P. In the following description, the X direction is referred to as a scanning direction and the Y direction perpendicular to the X direction is referred to as a non-scanning direction. Accordingly, the discharging nozzles of the liquid droplet discharging head 1 are arranged at predetermined intervals in the Y direction, that is, the non-scanning direction. In addition, while it is shown in FIG. 2 that the liquid droplet discharging head 1 is disposed to be perpendicular to a traveling direction of the substrate P, the head 1 may intersect the traveling direction of the substrate P by adjusting the angle of the liquid droplet discharging head 1. By adjusting the angle of the liquid droplet discharging head 1, the pitch between nozzles can be adjusted. In addition, the distance between the substrate P and a nozzle plane may be arbitrarily adjusted.

Figure 3:
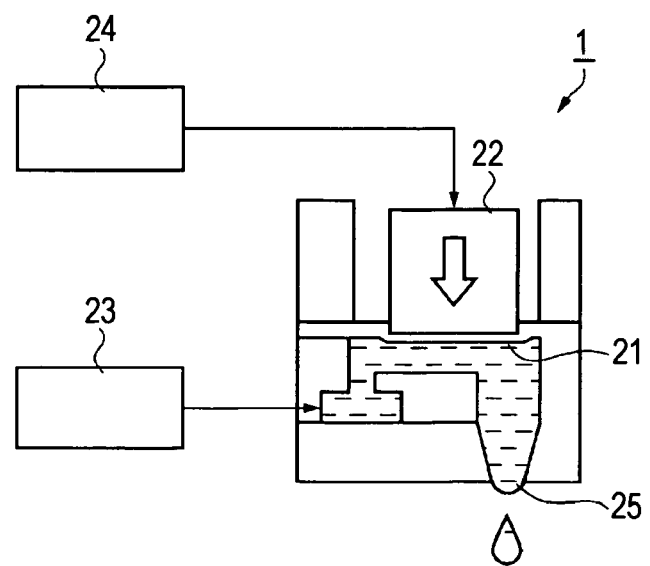
FIG. 3 is a view illustrating the principle of discharging liquid droplets according to a piezo system.

FIG. 3 is a view illustrating the principle of discharging liquid droplets according to a piezo system.

Referring to FIG. 3, a piezo element 22 is provided adjacent to a liquid chamber 21 accommodating the liquid material (wiring pattern ink and functional liquid). The liquid material is supplied to the liquid chamber 21 by a liquid material supply system 23 including a material tank storing the liquid material. The piezo element 22 is connected to a driving circuit 24. A voltage is applied to the piezo element 22 through the driving circuit 24 so as to deform the piezo element 22, and thus the liquid chamber 21 is deformed to discharge the liquid material from a nozzle 25. In this case, by changing the magnitude of an applied voltage, the amount of distortion of the piezo element 22 is controlled. In addition, by changing the frequency of the applied voltage, the speed of distortion of the piezo element 22 is controlled.

Since the liquid material is not heated when the liquid droplet is discharged according to the piezo system, there is an advantage in that composition of the liquid material is barely affected.

First Embodiment

Figure 4:
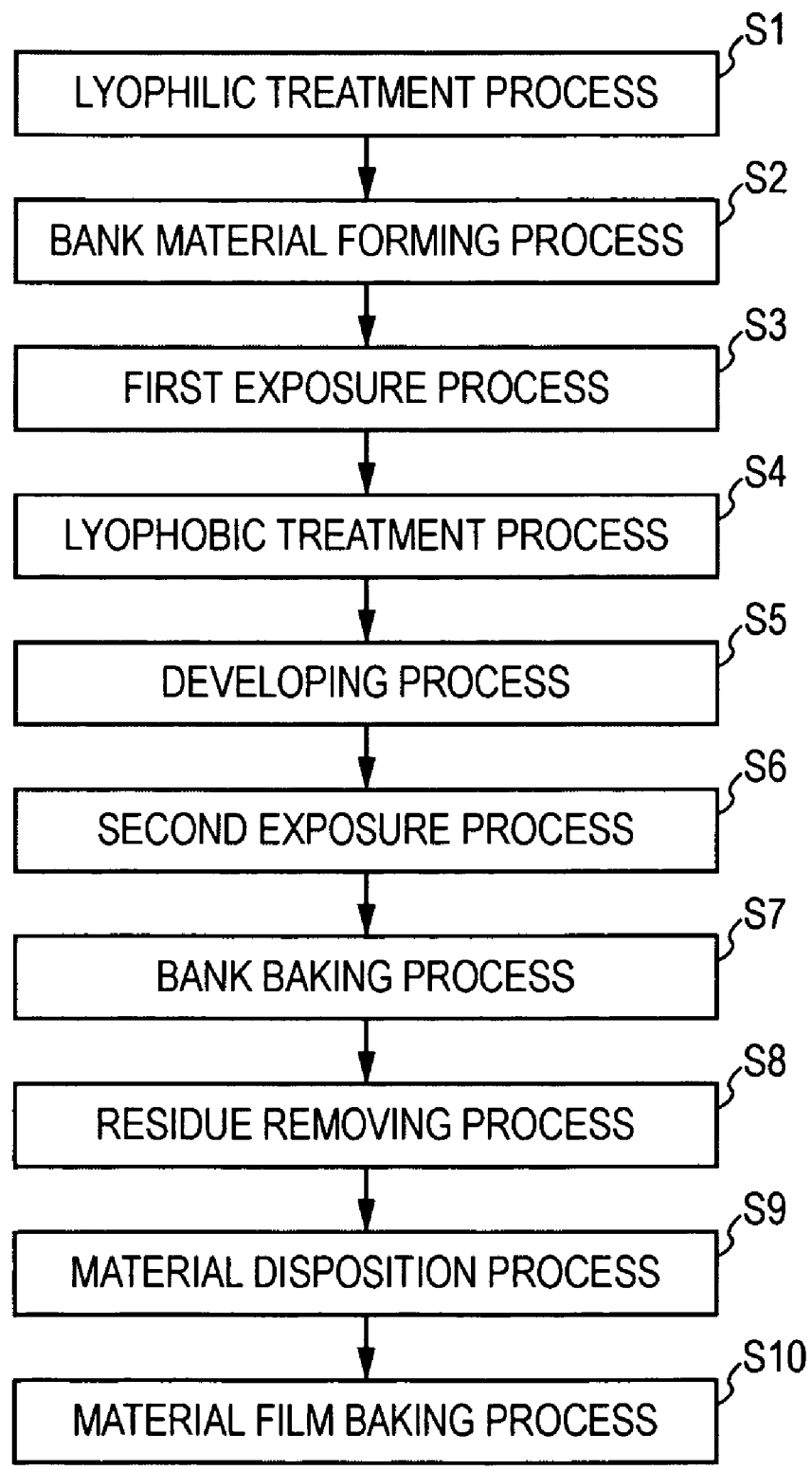
FIG. 4 is a flow chart illustrating a method of forming a film pattern according to a first embodiment of the invention.

Next, a method of forming a wiring pattern according to a first embodiment of the invention will be described with reference to FIGS. 4, 5A to 5E, 6A to 6E, and 7A to 7D. FIG. 4 is a flow chart illustrating an example of a method of forming a film pattern according to the present embodiment, and FIGS. 5A to 5E, 6A to 6E, and 7A to 7D are schematic views showing an order of forming a film pattern.

As shown in FIG. 4, in a method of forming a wiring pattern according to the present embodiment, the above-described ink for formation of wiring pattern is disposed on a substrate and a conductive wiring pattern is formed on the substrate. Specifically, the method generally includes a lyophilic treatment process S1 for performing lyophilic treatment on a surface of the substrate, bank forming processes S2 to S7 for forming banks according to the wiring pattern on the lyophilic substrate, a residue removing process S8 for removing residue between banks, a material disposition process S9 for disposing the ink between banks from which the residue has been removed, and a material film baking process S10 for making film components contained in the ink formed as a film and then baking the film.

Hereinafter, the respective processes will be described in detail. A glass substrate is used as the substrate P in the present embodiment.

Lyophilic Treatment Process

Figure 5A:
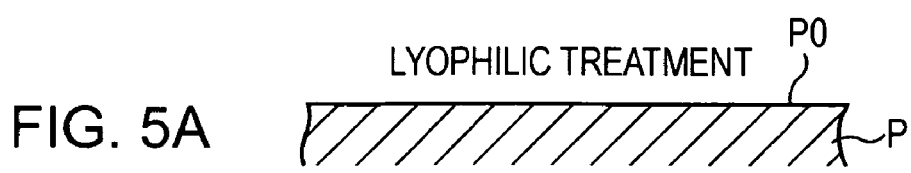
FIGS. 5A to 5E are process views illustrating an order of forming a film pattern.

First, as shown in FIG. 5A, a surface P0 of the substrate P is subjected to a lyophilic treatment in advance before the banks are formed (lyophilic treatment process S1).

The lyophilic treatment is performed to obtain the high wettability of the wiring pattern ink with respect to the substrate P in the material disposition process S9. In the lyophilic treatment, for example, a film having high lyophilic property, such as $TiO_2$, is formed on the surface of the substrate P. Alternatively, this treatment may be performed by making the surface of the substrate P irregular.

Bank Forming Process

Next, the banks are formed on the substrate P.

The banks function as partitions in the material disposition process S9. The formation of the banks may be performed by using a lithography method, a printing method, or other methods. If the lithography method is used, first, a material for forming the banks is applied onto the substrate P in accordance with the height of the banks by using a specific method such as spin coat, spray coat, roll coat, die coat, or deep coat (bank material forming process S2), and then, a surface of the formed film 31 is subjected to lyophobic treatment (lyophobic treatment process S4). Thereafter, a resist layer is applied on the film 31, and a mask is placed on the resist layer in accordance with the shape of the banks (wiring pattern). Then, after the resist layer is exposed and developed to leave only a resist in accordance with the shape of the banks, an etching process is performed to remove a bank material in portions other than the mask. In addition, if a photosensitive material is used as the bank material, it is possible to directly pattern the bank material without using the resist. In the embodiment, the bank material uses an inorganic material containing polysilazane as a main component, in particular, positive photosensitive polysilazane such as photosensitive polysilazane compositions containing polysilazane and photoacid generator, and a method of directly patterning the positive photosensitive polysilazane using exposure and development treatments is used. In addition, the lyophobic treatment process S4 may be performed before a first exposure process S3.

Figure 5B:
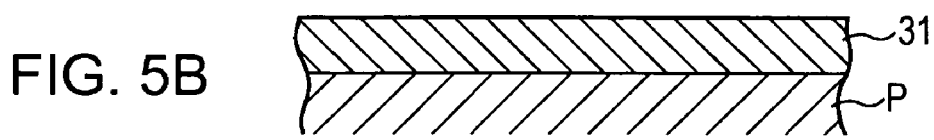

Here, as shown in FIG. 5B, first, an application film (film 31) made of the photosensitive polysilazane, which is the bank material, is formed on the substrate P in accordance with the height of the banks (bank material forming process S2).

Figure 5C:
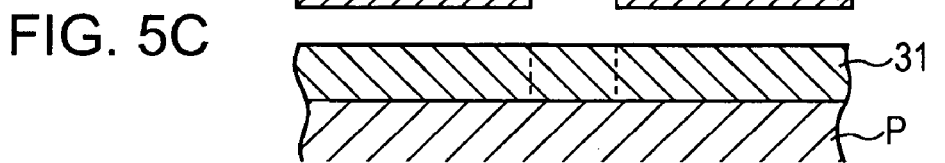
Figure 5D:
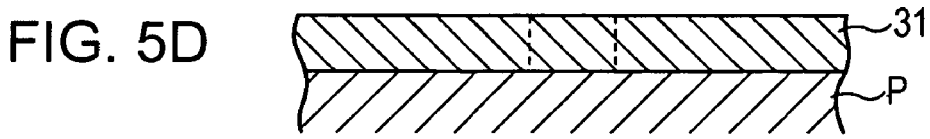

Next, as shown in FIG. 5C, the film 31 is exposed by using a mask (first exposure process S3), and then, as shown in FIG. 5D, the film 31 is humidified. This humidification allows nitrogen component, which is contained in the bank material and is a main cause of lowering light transmissivity, to be removed. In addition, this humidification treatment is performed under the conditions of the temperature at 25° C., humidity of 80% RH, and humidification time of 4 minutes.

Lyophobic Treatment Process

Figure 5E:
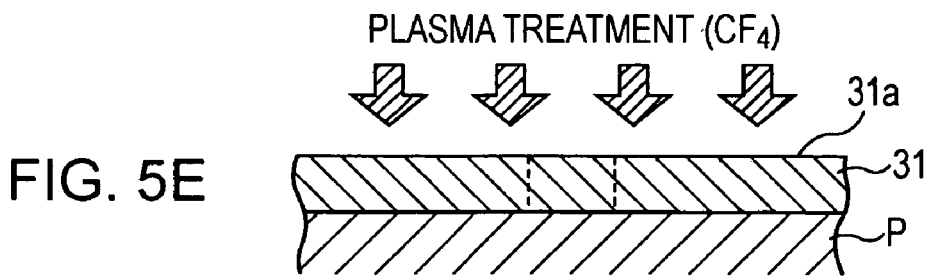

Subsequently, as shown in FIG. 5E, the film 31 is subjected to the lyophobic treatment so as to have a lyophobic property of a surface thereof (lyophobic treatment process S4).

The lyophobic treatment may use a plasma process using, for example, tetrafluoromethane as a process gas in an air atmosphere ($CF_4$ plasma process). The conditions for the $CF_4$ plasma process are, for example, the plasma power in the range of 50 to 1000 W, the flow rate of $CF_4$ in the range of 50 to 100 ml/min, the carrying speed of gas with respect to a plasma discharge electrode in the range of 0.5 to 1020 mm/sec, and the temperature of gas in the range of 70 to 90° C. In addition, as the process gas, other fluorocarbon gases may be used without being limited to tetrafluoromethane ($CF_4$).

Such lyophobic treatment allows a fluorine group to be introduced into materials of the film 31, thereby allowing high lyophobic property to the film 31.

In addition, even though the lyophobic treatment to the film 31 has more or less effect on the surface of the substrate P, which has been subjected to the lyophilic treatment, since the fluorine group is not introduced into the substrate P by the lyophobic treatment, particularly if the substrate P is made of glass or the like, the lyophilic property, that is, the wettability of the substrate P is not substantially deteriorated.

In addition, the lyophobic treatment may use a low pressure plasma process or a FAS vapor process, instead of the above-mentioned plasma process.

Next, as shown in FIG. 6A, a development treatment is performed to pattern the film 31 into the shapes of the banks (developing process S5). Once the film 31 is subjected to the lyophobic treatment and is then patterned, only an upper side 31a of the film 31 has the lyophobic property and lateral surfaces 31b of the film 31 does not have the lyophobic property. Accordingly, the film 31 shows high wettability for the functional liquid L, and thus, even when an opening (that is, a gap between banks B) of the film 31 narrows, the functional liquid L can be smoothly introduced into the opening. In addition, the development treatment is performed under the conditions of the developer of TMAH 2.38%, the temperature at 25° C., and the development time of 1 minute.

Next, as shown in FIG. 6B, the exposure treatment is performed for the entire surface of the substrate P (second exposure process S6). Then, as shown in FIG. 6C, the thin film 31 is humidified and is then baked (bank baking process S7). By exposing the film 31 before the baking process, dehydrogenation of hydrogen group contained in the bank material can be accelerated.

As described above, as shown in FIG. 6D, the banks B are provided to protrude at a width of, for example, 10 to 15 μm so as to surround a trench 34 in which the wiring pattern is to be formed.

Residue Removing Process

Next, as shown in FIG. 6E, residue remaining between the banks is removed (residue removing process S8).

The residue is removed by using one selected from an ultraviolet (UV) irradiation treatment for removing the residue by irradiating an ultraviolet ray, an $O_2$ plasma treatment using oxygen as a process gas in an air atmosphere, a fluoric acid treatment, etc. Here, the fluoric acid treatment is performed to remove the residue. The fluoric acid treatment is performed by etching out the residue with 0.2% fluoric acid aqueous solution, for example. In the fluoric acid treatment, bank materials remaining in the bottom 35 of the trench 34 formed between the banks B are removed by using the banks B as a mask.

Material Disposition Process

Next, by using the liquid droplet discharging method using the liquid droplet discharging apparatus IJ shown in FIG. 2, the wiring pattern formation material L is disposed on a region defined by the banks B on the substrate P, that is, between the banks B (material disposition process S9).

Figure 7A:
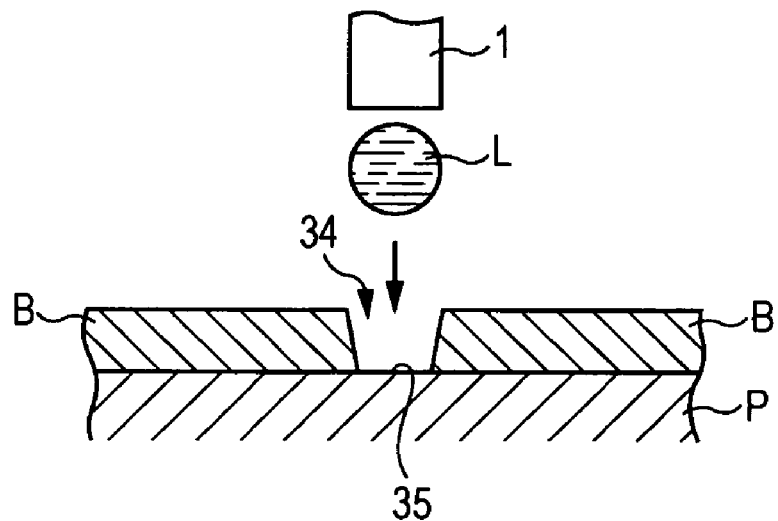
FIGS. 7A to 7D are process views subsequent to FIGS. 6A to 6E.
Figure 7B:
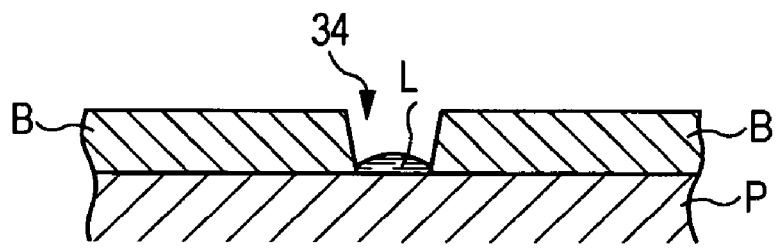

In the embodiment, the wiring pattern ink L (functional liquid) to be discharged is dispersion solution where conductive particles are dispersed in solvent (dispersion medium). The conductive particles used herein are metal particles containing one of gold, silver, copper, palladium and nickel, oxides thereof, particles of conductive polymer or superconductor, etc. In the material disposition process, as shown in FIG. 7A, the ink containing the wiring pattern formation material is discharged as liquid droplets from the liquid droplet discharging head 1. The discharged liquid droplets are disposed in the trench 34 between the banks B on the substrate P, as shown in FIG. 7B. The liquid droplets can be discharged under the conditions of the ink weight in the range of 4 to 7 ng/dot and the ink speed (discharging speed) in the range of 5 to 7 m/sec. In addition, the liquid droplets are preferably discharged under an atmosphere of temperature of less than 60° C. and humidity of less than 80%. Accordingly, the liquid droplets can be consistently discharged without the discharging nozzles of the liquid droplet discharging head 1 being blocked.

At this time, since a region (that is, the trench 34), in which the wiring pattern is to be formed and into which the liquid droplets are to be discharged, is surrounded by the banks B, the liquid droplets can be prevented from spreading beyond a predetermined area. In addition, since the upper surfaces of the banks B have the lyophobic property, even when some of the discharged liquid droplets move above the banks B, some of the discharged liquid droplets are repelled from the banks B to flow down into the trench 34 between the banks B. In addition, since the bottom 35 of the trench 34 on which the substrate P is exposed has the lyophilic property and the lateral surfaces of the banks B do not have the lyophobic property due to not being subjected to the lyophobic treatment in the process S4, the discharged liquid droplets smoothly spread in the bottom 35, and accordingly, the ink is uniformly disposed in the predetermined position.

Intermediate Drying Process

Figure 7C:
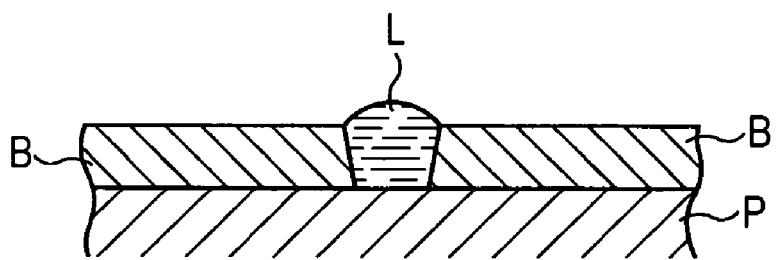

After the liquid droplets are discharged onto the substrate P, dry treatment is performed to remove the dispersion medium and secure a thickness of the film, if necessary. The dry treatment can be performed by using, for example, a typical hot plate or electric furnace for heating the substrate P, or lamp annealing. A light source used for the lamp annealing may include an infrared lamp, a xenon lamp, a YAG laser, an argon laser, a carbon dioxide laser, an excimer laser using XeF, XeCl, XeBr, KrF, KrCl, ArF, or ArCl, etc., but not limited thereto. The power of these light sources is generally used within a range of 10 to 5000 W. In the embodiment, the power is sufficient if it is within a range of 100 to 1000 W. In addition, the intermediate drying process and the above-described material disposition process may be repeatedly performed so as to stack a plurality of liquid droplet layers of the liquid material such that a thick wiring pattern (film pattern) is formed (FIG. 7C).

Baking Process

Next, a dried film dried in the intermediate drying process is baked (material film baking process S10).

The dispersion medium is required to be completely removed in order to obtain good electrical contact between particles in the dried film after the discharging process. In addition, if a coating material such as an organic material is coated on surfaces of the conductive particles in order to improve dispersibility, the coating material is required to be removed. Accordingly, the substrate P after the discharging process is subjected to heat treatment and/or optical treatment.

The heat treatment and/or optical treatment are typically performed in the air, but may be performed in an inert gas atmosphere such as nitrogen, argon or helium, if necessary. The treatment temperature in the heat treatment and/or optical treatment is properly determined in consideration of a boiling point (vapor pressure) of the dispersion medium, the kind or pressure of atmosphere gases, thermal behavior of particles such as dispersibility or oxidization, the presence or amount of coating material, heat-resistant temperature of base material, etc. For example, removal of a coating material composed of an organic material requires baking at about 300° C. In this case, for example, a low-melting point glass may be applied in advance on the banks B and the dried film of the liquid material. When polysilazane, polysilane or polysiloxane is selected as a main component of the material for forming the banks B, the material for forming the banks B is sintered by the heat treatment to have a structure of a siloxane skeleton and becomes different in property from the original material for forming the bank.

For example, when polysilazane of the bank material is polymethylsilazane [—$(SiCH_3(NH)_{1.5})$n-], the polymethylsilazane is partially hydrolyzed into a form of [—$SiCH_3(NH)(OH)$] by humidification treatment. Next, [—$SiCH_3(NH)(OH)$] is condensed into a form of polymethylsiloxane [—$(SiCH_3O_{1.5})$—]. Since a skeleton, that is, the main component, of polymethylsiloxane is an inorganic material, polymethylsiloxane has high tolerance to the heat treatment.

In addition, if the substrate P is formed of plastic or the like, it is preferable to perform the heat treatment at room temperature or higher and 100° C. or less.

Figure 7D:
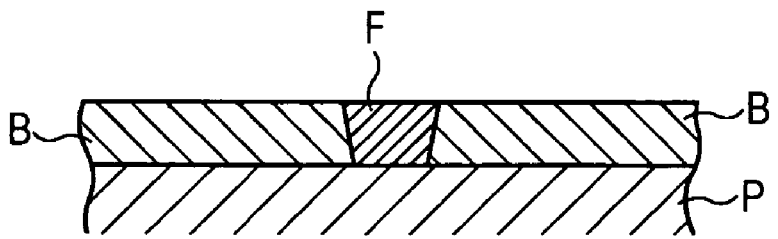

According to the above-described processes, since electrical contact between particles is secured in the dried film after the discharging process, the dried film is changed to a conductive film (film pattern F) as shown in FIG. 7D.

In the embodiment, since the lyophobic treatment of the banks is performed before the banks are patterned, that is, in the process of forming the film 31, only the upper surfaces of the banks B have lyophobic property and the lateral surfaces of the banks B do not have the lyophobic property. Accordingly, even when a fine film pattern F is formed, the functional liquid L is smoothly introduced into the gap between the banks B, and thus the regularity of the film is improved. In addition, since the banks B are formed by using an inorganic material, the banks B have high heat-resistance, and the difference in the coefficients of thermal expansion between the banks B and the substrate P is small. Accordingly, the banks B may be prevented from being deteriorated due to high temperature during the baking treatment, and thus the film pattern F having a desired shape can be obtained. In addition, the banks B may be prevented from being deteriorated even in a subsequent baking process for other portions of the substrate.

Second Embodiment

Next, a method of forming a film pattern according to a second embodiment of the invention will be described with reference to the flow chart of FIG. 4 and FIGS. 8A to 8D and 9A to 9D. In the embodiment, the same members or portions as in the first embodiment are denoted by the same reference numerals, and detailed explanation thereof will be omitted.

While the bank material in the first embodiment includes the material containing polysilazane as the main component and photosensitive polysilazane containing photoacid generator, the bank material in the second embodiment includes polysiloxane and photosensitive polysiloxane containing photoacid generator.

The second embodiment is similar to the first embodiment except that the former has no humidification treatment during a manufacturing process. This is because there is no need to perform humidification treatment since polysiloxane does not have a nitrogen component when polysiloxane is used as a main component of the bank material, even though the nitrogen component is removed when the humidification treatment is performed when polysilazane is used as the main component of the bank material.

Figure 8A:
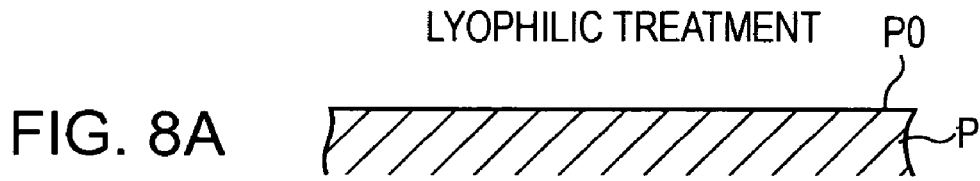
FIGS. 8A to 8D are process views illustrating an order of forming a film pattern according to a second embodiment of the invention.
Figure 8B:
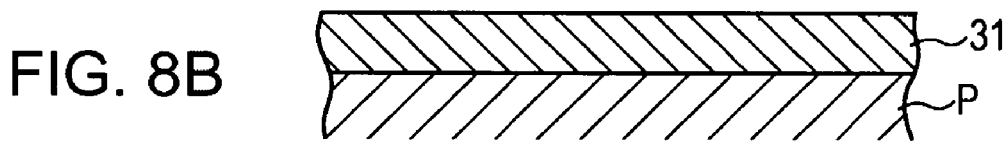
Figure 8C:
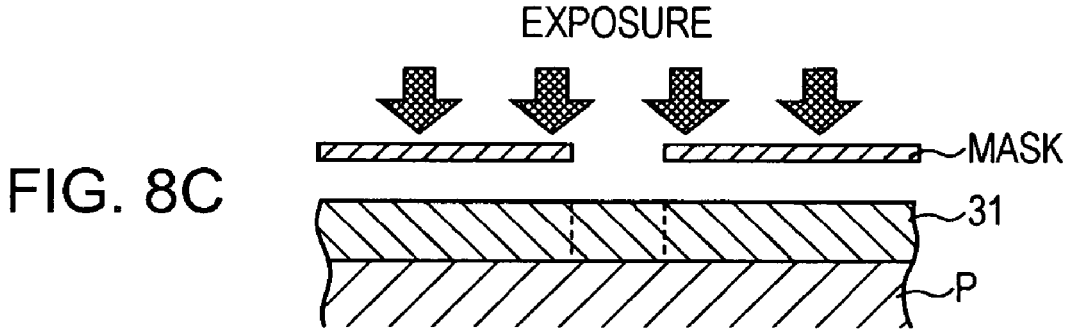
Figure 8D:
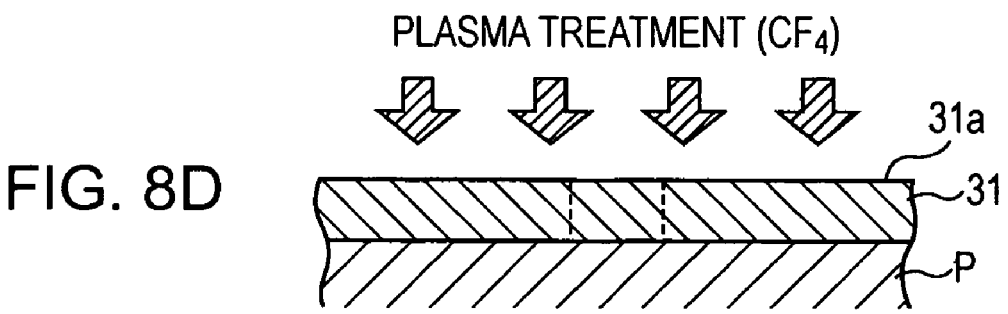
Figure 9A:
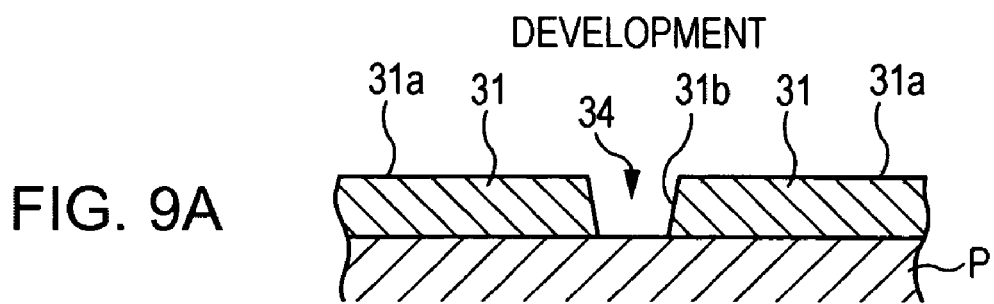
FIGS. 9A to 9D are process views subsequent to FIGS. 8A to 8D.
Figure 9B:
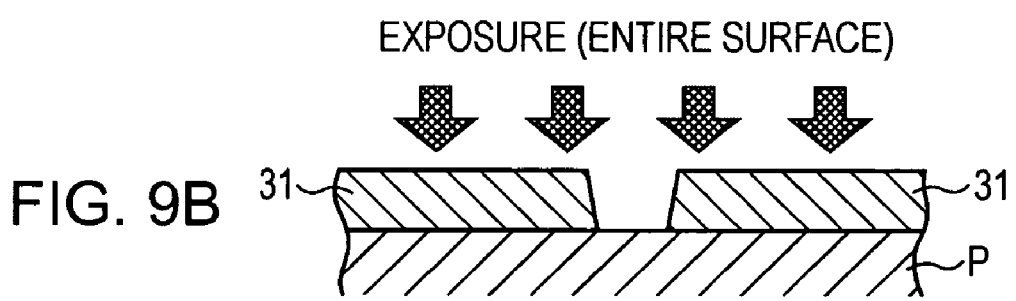
Figure 9C:
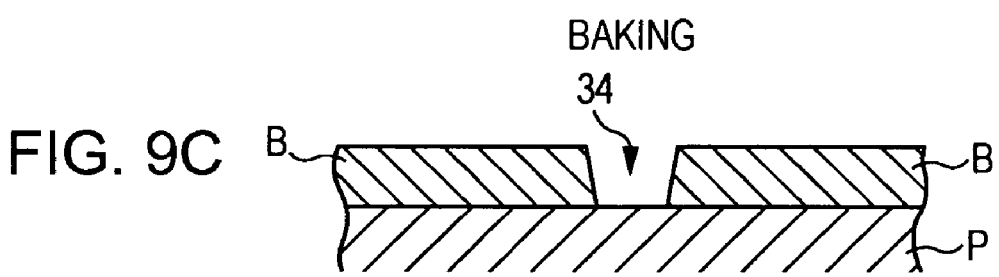
Figure 9D:
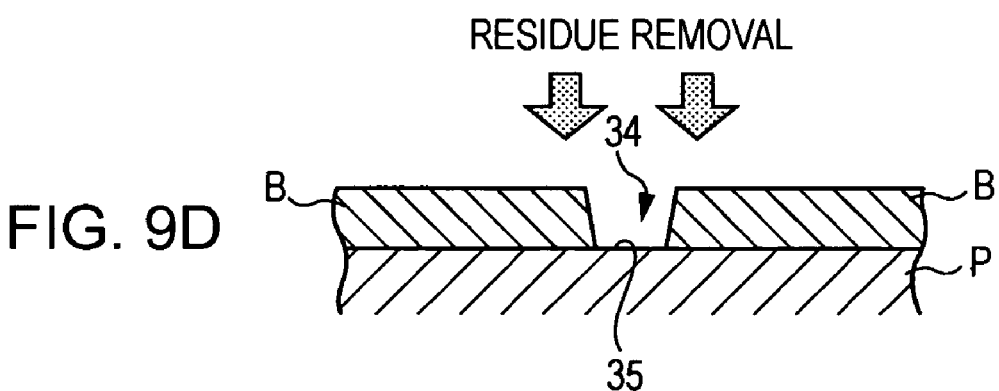

After performing a lyophilic treatment process S1 (FIG. 8A) and a bank material forming process S2 (FIG. 8B), the thin film 31 is exposed (first exposure process S3) as shown in FIG. 8C, and then plasma treatment which is lyophobic treatment is performed for the film 31 (lyophobic treatment process S4), without performing humidification treatment, as shown in FIG. 8D. Then, development treatment is performed (development process S5), as shown in FIG. 9A, the film 31 is exposed (second exposure process S6), as shown in FIG. 9B, and then, bank baking treatment is performed (bank baking process S7), without performing humidification treatment, as shown in FIG. 9C. Subsequently, a residue removing process S8 (FIG. 9D), a material disposition process S9 and a material film baking process S10 are performed to form a conductive film (film pattern F).

The invention is not limit to these processes, and may change or omit some of the processes, if necessary. For example, the bank baking process S7 may be omitted and, instead, the banks and the material film may be simultaneously baked at the process S10.

As described above, the second embodiment has the following effect in addition to the operation and effect of the first embodiment.

According to the second embodiment, since the humidification process can be omitted, there is no need to wait for the substrate to undergo the humidification treatment, thus improving productivity.

Third Embodiment

Next, a method of forming a film pattern according to a third embodiment of the invention will be described with reference to FIG. 10. In the embodiment, the same members or portions as in the first and second embodiments are denoted by the same reference numerals, and detailed explanation thereof will be omitted.

A method of forming a film pattern according to the third embodiment includes a bank forming process for forming the banks B on the substrate P and a material disposition process for disposing the functional liquid L on a line-shaped region A defined by the banks B. The bank forming process uses the same method as in the first embodiment.

In the method of forming the film pattern according to the third embodiment, the functional liquid L is disposed on the line-shaped region A defined by the banks B, and a line-shaped film pattern F is formed on the substrate P by drying the functional liquid L, for example. In this case, since the shape of the film pattern F is defined by the banks B, the film pattern F can be made fine or thin by properly forming the banks B, for example, by narrowing the width between adjacent banks B. In this case, it is preferable that the lateral surfaces of the banks B have high wettability with respect to the functional liquid L, and since the lateral surfaces of the banks B does not become lyophobic in the method of the first embodiment, even when the gap between the banks B is small, the functional liquid L can be smoothly introduced into the gap between the banks B according to a capillary phenomenon.

In addition, after the film pattern F is formed, the banks B may be removed from the substrate P or may be left on the substrate P.

In addition, in the method of forming the film pattern according to the third embodiment, when the banks B are formed on the substrate P, the width of a portion of the line-shaped region A defined by the banks B is set to be large. Specifically, a single or plurality of portions having a width Wp (Wp>W, hereinafter, referred to as 'wide portion As, if necessary) larger than a width W of other portions is provided at a predetermined position in an axis direction of the line-shaped region A.

In the method of forming the film pattern according to the third embodiment, by widening a portion (wide portion As) of the line-shaped region A defined by the banks B, some of the functional liquid L is extracted into the wide portion As when the functional liquid L is disposed, thus preventing the functional liquid L from overflowing the banks B.

In general, when liquid is disposed in a line-shaped region, it is difficult for the liquid to be introduced into the region due to a surface tension of the liquid or the liquid does not easily spread within the region. However, in the method of forming the film pattern according to the third embodiment, the introduction of the functional liquid L into the line-shaped region A or the spread of the functional liquid L within the line-shaped region A is accelerated due to movement of the liquid in the wide portion As, thus preventing the functional liquid L from overflowing the banks B. In addition, it goes without saying that the functional liquid is disposed within the line-shaped region A by a predetermined amount.

In this manner, in the method of forming the film pattern according to the third embodiment, since the functional liquid L is prevented from overflowing the banks B when the functional liquid L is disposed, the film pattern F is precisely formed in a desired shape. Accordingly, a fine film pattern F can be consistently formed with high precision.

Further, in the embodiment, since the banks B are formed by the method described in the first embodiment, only the upper surfaces of the banks B have the lyophobic property and the lateral surfaces of the banks B do not have the lyophobic property. Accordingly, even when a fine film pattern F is formed, the functional liquid L is smoothly introduced into the gap between the banks B, thus improving the regularity of the film.

Here, in the line-shape region A defined by the banks B, the width Wp of the wide portion As is preferably in the range of 110 to 500% of the width W of other portions. Accordingly, when the functional liquid L is disposed, the functional liquid L can be reliably prevented from overflowing the banks. If the width Wp is less than 110% of the width W, it is not desirable because the functional liquid does not sufficiently flow into the wide portion As. In contrast, if the width Wp is more than 500% of the width W, it is not desirable because the wide portion As occupies too much space on the substrate P.

In addition, the line-shaped region A is not limited to the shape shown in FIG. 10 but may have different shapes. The number, size, disposition position, and disposition pitch of wide portion As in the line-shaped region A are properly set depending on the quality or width of the material of the film pattern or required precision of the film pattern.

Fourth Embodiment

Next, a method of forming a film pattern according to a fourth embodiment of the invention will be described with reference to FIGS. 11, 12A, and 12B. In the embodiment, the same members or portions as in the first to third embodiments are denoted by the same reference numerals, and detailed explanation thereof will be omitted.

Figure 11:
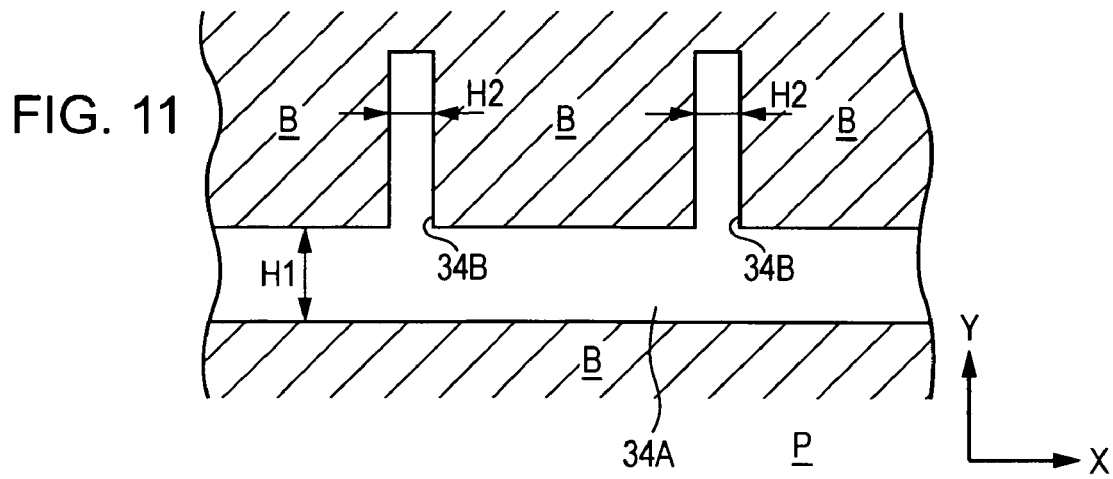
FIG. 11 is a process view illustrating a method of forming a film pattern according to a fourth embodiment of the invention.

As shown in FIG. 11, on the substrate P are formed a first trench 34A (a wide region) having a first width H1 and a second trench 34B (a narrow region) connected to the first trench 34A and having a second width H2, both of which are defined by the banks B. The first width H1 is larger than the flight diameter of the functional liquid. The second width H2 is smaller than the first width H1. In other words, the second width H2 is less than the first width H1. In addition, the first trench 34A extends in an X axis in FIG. 11 and the second trench 34B extends in a Y direction perpendicular to the X axis in FIG. 11. The banks B are formed by the method described in the first embodiment.

Figure 12A:
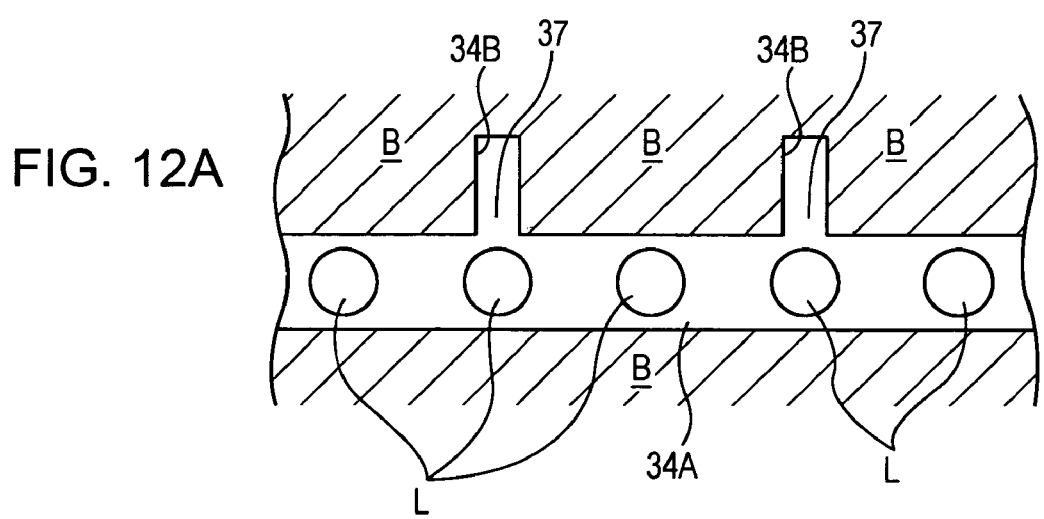
FIGS. 12A and 12B are views illustrating another method of forming a film pattern according to the fourth embodiment.

In order to form the film pattern F in the above-described trenches 34A and 34B, first, liquid droplets of the functional liquid L containing wiring pattern ink for formation of the film pattern F are disposed at a predetermined position in the first trench 34A, as shown in FIG. 12A. When the liquid droplets of the functional liquid L are disposed in the first trench 34A, the liquid droplets are discharged from an upper side of the first trench 34A to the first trench 34A by using the liquid droplet discharging head 1. In the embodiment, the liquid droplets of the functional liquid L are disposed at predetermined intervals in a longitudinal direction (X direction) of the first trench 34A, as shown in FIG. 12A. At this time, the liquid droplets of the functional liquid L are also disposed in the first trench 34A near a connection portion 37 (an intersecting region) at which the first trench 34A and the second trench 34B are connected to each other.

Figure 12B:
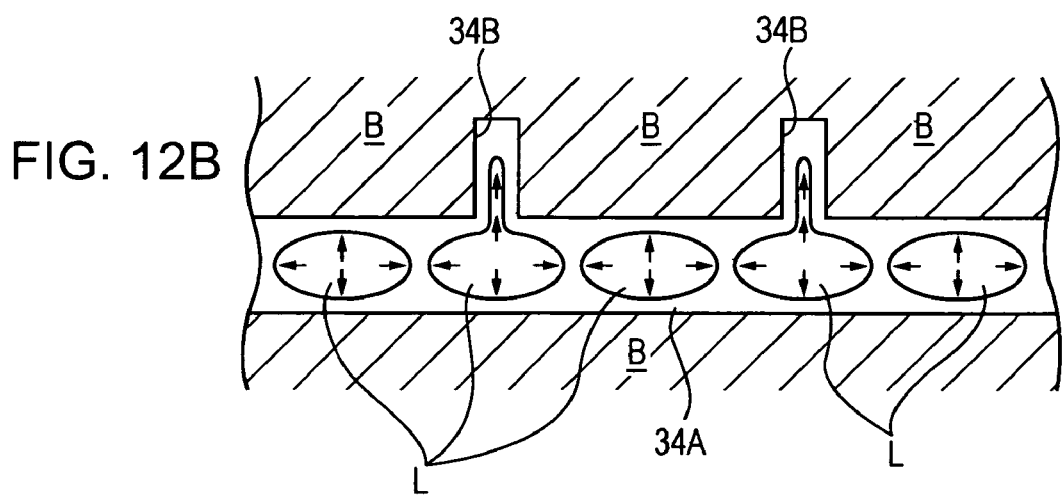

As shown in FIG. 12B, the functional liquid L disposed in the first trench 34A is absorbed and spread in the first trench 34A by self-flow. The functional liquid L disposed in the first trench 34A is also absorbed and spread in the second trench 34B by self-flow. Accordingly, it is possible to dispose the functional liquid L in the second trench 34B without directly discharging the liquid droplets from an upper side of the second trench 34B to the second trench 34B. In this case, it is preferable that the lateral surfaces of the banks B have high wettability, but, since the lateral surfaces of the banks B do not have lyophobic property in the method of the first embodiment, even when the gap between the banks B is small, the functional liquid L can be smoothly introduced in the gap between the banks B according to a capillary phenomenon.

In this way, by disposing the functional liquid L in the first trench 34A, the functional liquid L can be disposed in the second trench 34B by the self-flow (capillary phenomenon) of the functional liquid L disposed in the first trench 34A. Accordingly, without discharging the liquid droplets of the functional liquid L from an upper side of the banks B to the second trench 34B having the second width H2 (small width), the functional liquid L can be smoothly disposed in the second trench 34B by discharging the liquid droplets of the functional liquid L in the first trench 34A having the first width H1 (larger width). In particular, even if the width H2 of the second trench 34B is small and the diameter of the liquid droplets discharged from the liquid droplet discharging head 1 (diameter of the liquid droplets in flight) is larger than the width H2, the functional liquid L can be smoothly disposed in the second trench 34B by the self-flow of the functional liquid L. In addition, since the width H2 of the second trench 34B is small, the functional liquid L is smoothly disposed in the second trench 34B by the capillary phenomenon. Accordingly, a film pattern having a desired shape can be obtained. In addition, since the functional liquid L can be smoothly disposed in the second trench 34B having the small width, the film pattern can be made thin or fine. On the other hand, since the width Hi of the first trench 34A is large, even when the liquid droplets of the functional liquid L are discharged from the upper side of the banks B to the first trench 34A, it is possible to avoid a problem with residue which may occur when some of the functional liquid L is left on the banks. Accordingly, a film pattern F showing a desired property can be consistently formed.

Further, according to the present embodiment, since the functional liquid L is disposed in the first trench 34A near the connection portion 37 at which the first trench 34A and the second trench 34B are connected to each other, the functional liquid L can be easily introduced into the second trench 34B when the functional liquid L is absorbed and spread, thus allowing the functional liquid L to be easily disposed in the second trench 34B.

In addition, in the embodiment, since the banks B are formed by the method described in the first embodiment, only the upper surfaces of the banks B have the lyophobic property and the lateral surfaces of the banks B does not have the lyophobic property. Accordingly, even when a fine film pattern F is formed, the functional liquid L is smoothly introduced into the gap between the banks B, thus improving the regularity of the film.

After disposing the functional liquid L in the first trench 34A and the second trench 34B, the film pattern can be formed by performing the intermediate drying process and the baking process in the same manner as in the first embodiment.

Figure 13:
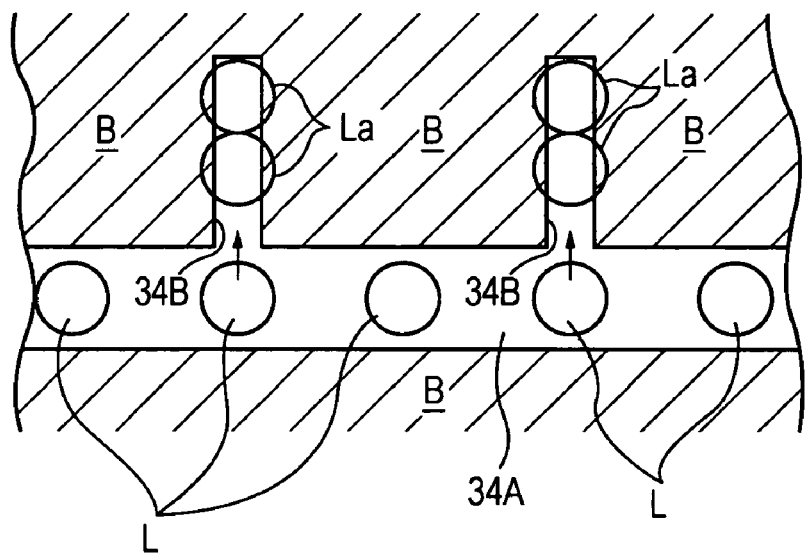
FIG. 13 is a view illustrating yet another method of forming a film pattern according to the fourth embodiment.

Further, as shown in FIG. 13, after discharging and disposing functional liquid La composed of only solvent in the second trench 34B, the functional liquid L may be disposed as described above. In this manner, by discharging and disposing the functional liquid La in the second trench 34B, the functional liquid L can be easily introduced into the second trench 34B, thus allowing the functional liquid L to be easily disposed in the second trench 34B. In addition, the functional liquid La has no conductivity because the functional liquid La includes no conductive particles. Accordingly, there is no variation of a desired property of the film pattern F even if residue of the functional liquid L is left on the banks B.

Figure 14A:
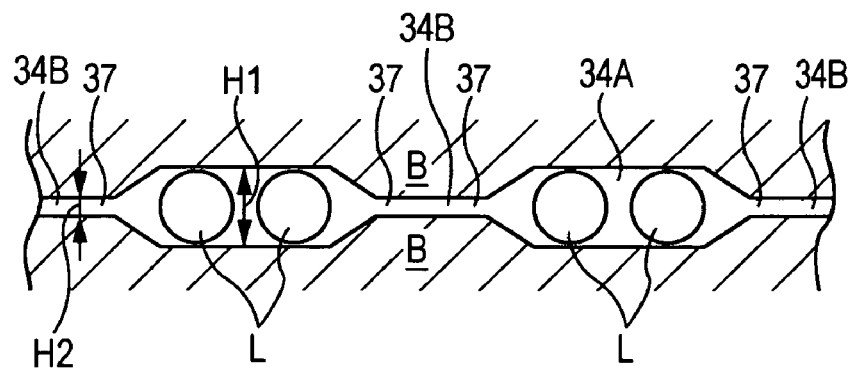
FIGS. 14A and 14B are views illustrating yet another method of forming a film pattern according to the fourth embodiment.
Figure 14B:
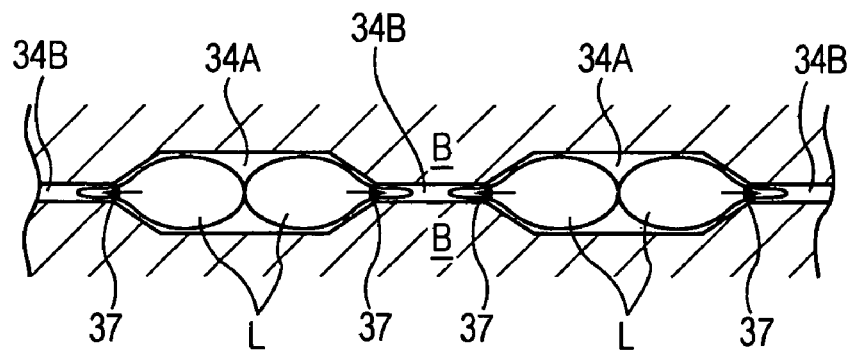

Furthermore, although it is shown in FIGS. 11, 12A and 12B, and 13 that the extended direction of the first trench 34A having the first width H1 (large width) is different from that of the second trench 34B having the second width H2 (small width), the first trench 34A having the first width H1 (large width) may have the same extended direction as the second trench 34B having the second width H2 (small width), as shown in FIGS. 14A and 14B. In this case, by disposing the functional liquid L in the first trench 34A, as shown in FIG. 14A, the functional liquid L can be disposed in the second trench 34B by the self-flow of the functional liquid L, as shown in FIG. 14B. In addition, in this case, by making the connection portion 37 between the first trench 34A and the second trench 34B have a tapered shape where the connection portion 37 becomes narrower from the first trench 34A toward the second trench 34B, the functional liquid L disposed in the first trench 34A can be smoothly introduced into the second trench 34B.

Thin Film Transistor

Figure 15:
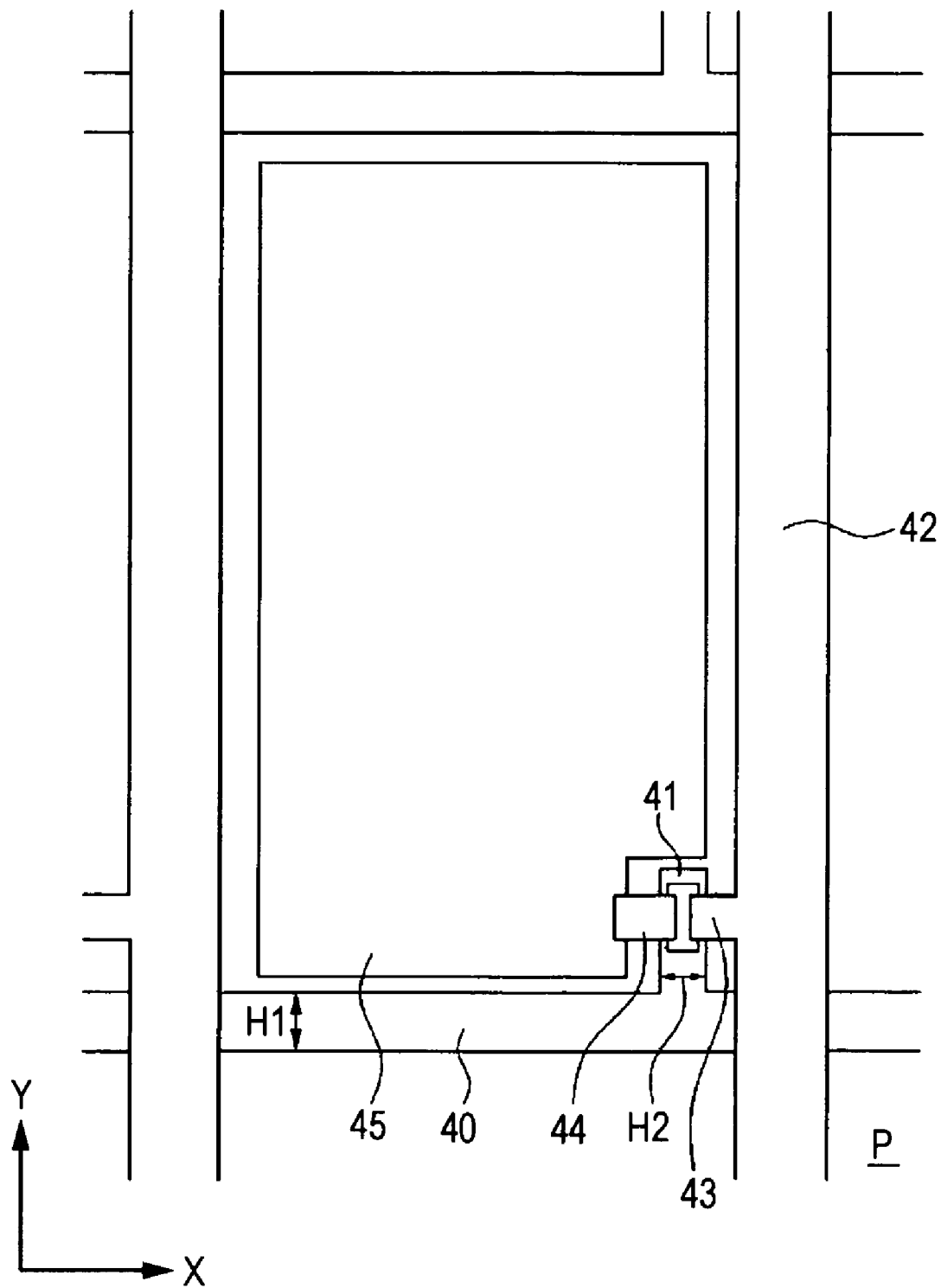
FIG. 15 is a view schematically illustrating an example of a substrate having a thin film transistor.

The method of forming the film pattern according to the embodiments of the invention can be applied when a thin film transistor (TFT) serving as a switching element and wiring lines connected thereto are formed, as shown in FIG. 15. As shown in FIG. 15, on a TFT substrate P having TFTs are provided gate wiring lines 40, gate electrodes 41 electrically connected to the gate wiring lines 40, source wiring lines 42, source electrodes 43 electrically connected to the source wiring lines 42, drain electrodes 44, and pixel electrodes 45 electrically connected to the drain electrodes 44. The gate wiring lines 40 extend in the X axis direction and the gate electrodes 41 extend in the Y axis direction. In addition, the width H2 of the gate electrode 41 is smaller than the width H1 of the gate wiring line 40. The gate wiring lines 40 and the gate electrodes 41 can be formed by using the method of forming the wiring pattern according to the embodiments of the invention.

Further, while it is shown in the embodiment that the gate wiring lines of the TFT are formed by using the method of forming the wiring pattern according to the above-described embodiments of the invention, other elements, such as the source electrodes, the drain electrodes, and the pixel electrodes, may be formed by using the same method. Hereinafter, a method of manufacturing the TFT will be described with reference to FIGS. 16A to 16D.

Figure 16A:
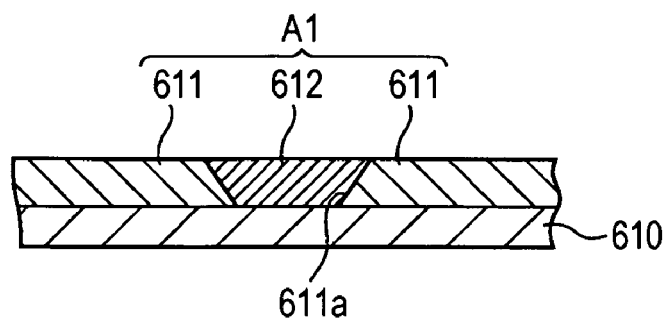
FIGS. 16A to 16D are views illustrating a process of manufacturing a thin film transistor.

As shown in FIG. 16A, first, a first layer of banks 611 for forming a trench 611a having a width of ½0 to ⅟10 of one pixel pitch is formed on a cleaned glass substrate 610 by using a photolithography method. The banks 611 preferably include an inorganic material containing polysilazane as a main component.

The banks 611 are formed by the method described in the first embodiment. Accordingly, only the upper surfaces of the banks 611 have the lyophobic property and the lateral surfaces of the banks 611 do not have the lyophobic property.

The contact angle of the banks 611 with respect to discharging ink is preferably more than 40° and the contact angle of a glass plane with respect to the discharging ink is preferably less than 10°.

In a gate scanning electrode forming process subsequent to the process of forming the first layer of banks, a gate scanning electrode 612 is formed by discharging liquid droplets containing a conductive material by an inkjet method such that the liquid droplets fill the trench 611a, which is the patterning region defined by the banks 611.

At this time, preferably, the conductive material is Ag, Al, Au, Cu, palladium, Ni, W—Si, conductive polymer, etc. Since the banks 611 have sufficient lyophobic property in advance, a fine wiring pattern for the gate scanning electrode 612 can be formed without deviating from the trench 611a.

Through the above processes, a first conductive layer Al having a flat top surface and composed of the banks 611 and the gate scan electrode 612 is formed on the substrate 610.

In addition, in order for the discharge to be effective in the trench 611a, it is preferable to use a quasi-taper (tapered shape in a direction which is open toward a discharging source) as the shape of the trench 611a, as shown in FIG. 16A. Accordingly, the discharged liquid droplets are allowed to be introduced deeply into the trench 611.

Figure 16B:
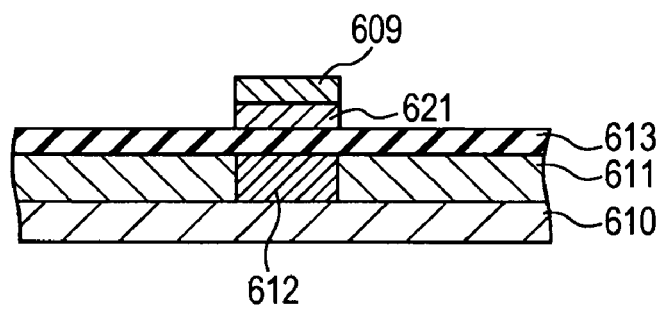

Next, as shown in FIG. 16B, a gate insulating film 613, an activation layer 621, and a contact layer 609 are consecutively formed by a plasma CVD method. The gate insulating film 613, the activation layer 621, and the contact layer 609 are formed of a silicon nitride film, an amorphous silicon film, and an n$^+$ silicon film, respectively, by changing the amount of raw material gas and the plasma condition. Even though the CVD method requires a heat maximum in the range of 300 to 350° C., an occurrence of transparency and heat-resistance can be prevented by using an inorganic material in the banks.

Figure 16C:
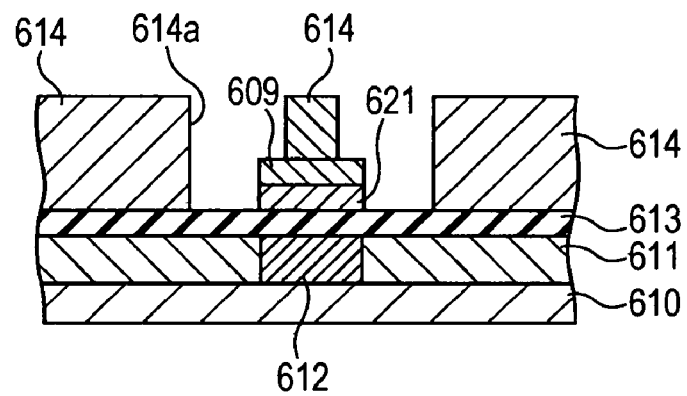

In a process of forming a second layer of banks, which is subsequent to the process of forming the semiconductor layer, as shown in FIG. 16C, a second layer of banks 614 for forming a trench 614a having a width in the range of 1/20 to 1/10 of one pixel pitch and intersecting the trench 611a is formed on the gate insulating film 613 by using a photolithography method. The banks 614 require light transparency and lyophobic property and preferably include an inorganic material containing polysilazane as a main component in the same manner the banks 611. The banks 614 can be formed by using the same method described in the embodiment.

The contact angle of the lyophobic banks 614 with respect to discharging ink is preferably more than 40°.

Figure 16D:
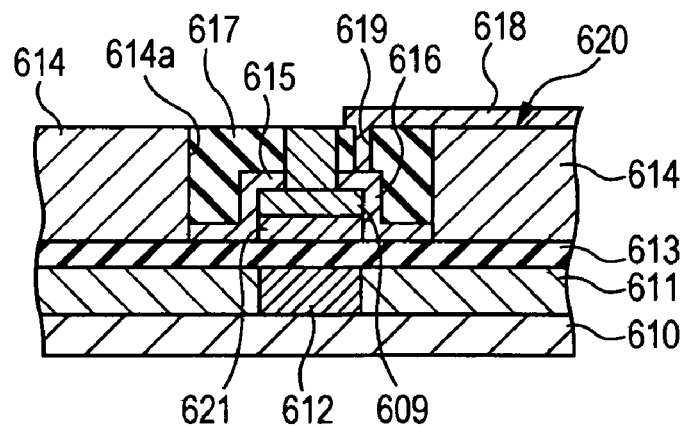

In a source/drain electrode forming process subsequent to the process of forming the second layer of banks, a source electrode 615 and a drain electrode 616, both of which intersect the gate scanning electrode 612, are formed, as shown in FIG. 16D, by discharging liquid droplets containing a conductive material from an inkjet such that the liquid droplets fill the trench 614a, which is a patterning region defined by the banks 614.

At this time, preferably, the conductive material is Ag, Al, Au, Cu, palladium, Ni, W—Si, conductive polymer, etc. Since the banks 614 have sufficient lyophobic property in advance, a fine wiring pattern for the source electrode 615 and drain electrode 616 can be formed without deviating from the trench 614a.

In addition, an insulating material 617 is disposed to fill the trench 614a in which the source electrode 615 and the drain electrode 616 are disposed. Through the above-described processes, on the substrate 610 is formed a flat top side 620 composed of the banks 614 and the insulating material 617.

Then, a contact hole 619 is formed in the insulating material 617, a patterned pixel electrode (ITO) 618 is formed on the top side 620, and the drain electrode 616 and the pixel electrode 618 are connected to each other through the contact hole 619, thereby forming a TFT.

Gate electrodes of all switching elements may be formed by using the film pattern formation method described in the above embodiments. Alternatively, some of the gate electrodes may be formed by using the film pattern formation method described in the above embodiments and some of the gate electrodes may be formed by using a photolithography process. In consideration of methods of forming other elements, the method having high productivity may be performed.

In the same manner, all gate wiring lines may be formed by using the film pattern formation method described in the above embodiments. Alternatively, some of the gate wiring lines may be formed by using the film pattern formation method described in the above embodiments and some of the gate wiring lines may be formed by using a photolithography process. In consideration of methods of forming other elements and wiring lines, the method having high productivity may be performed.

Electro-Optical Device

Next, a liquid crystal display device, which is an example of an electro-optical device of the invention, will be described.

Figure 19:
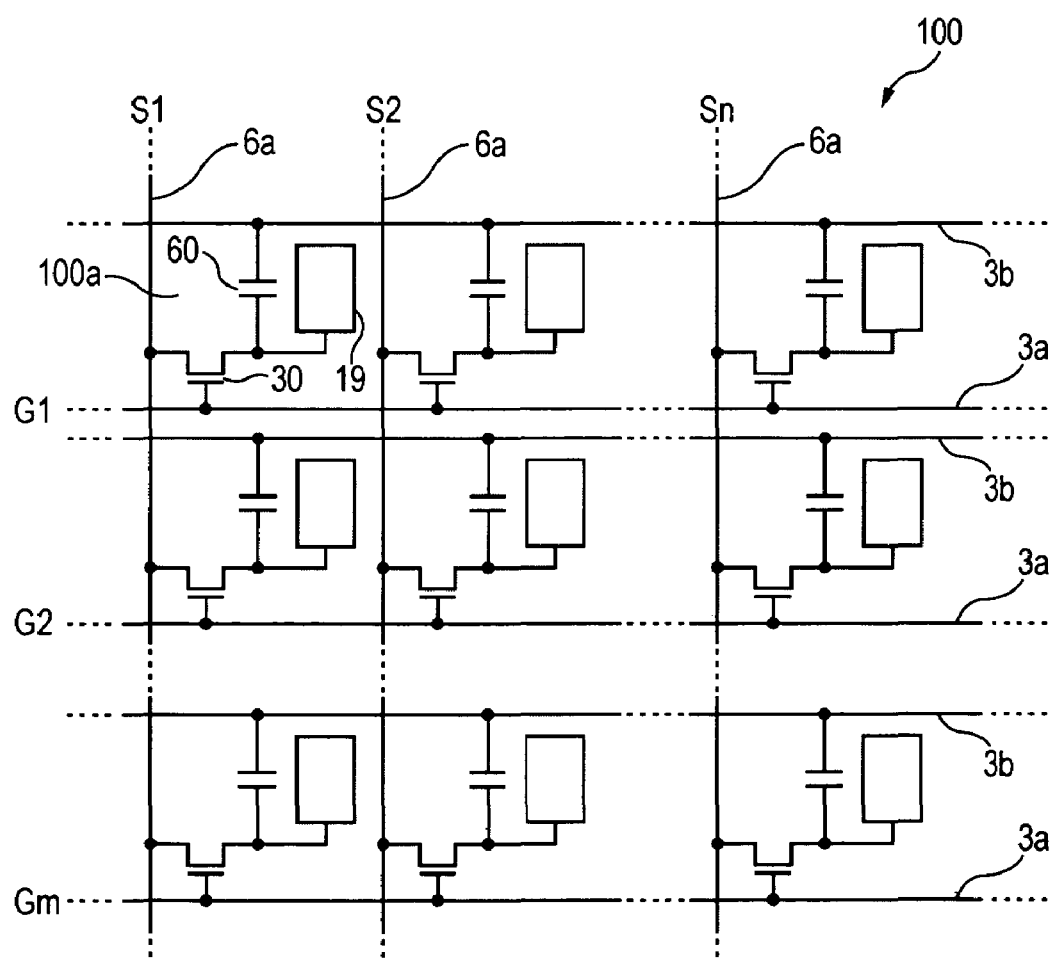
FIG. 19 is an equivalent circuit diagram of a liquid crystal display device.
Figure 20:
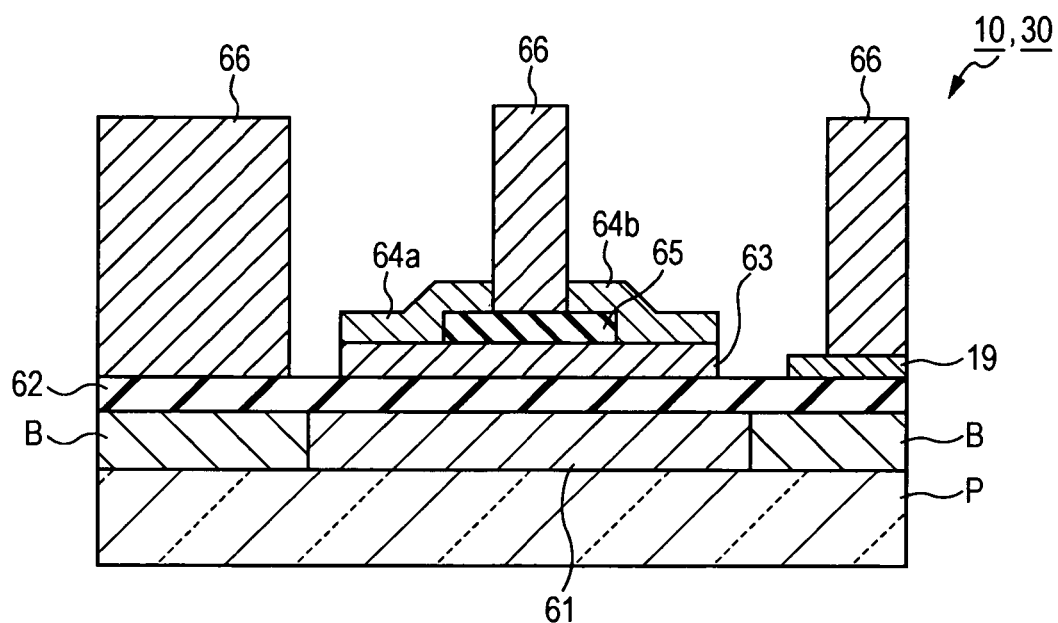
FIG. 20 is a partially enlarged sectional view of the liquid crystal display device.

FIG. 17 is a plan view illustrating various elements of a liquid crystal display device of the invention, when viewed from a counter substrate side, and FIG. 18 is a cross-sectional view taken along the line XVIII-XVIII of FIG. 17. FIG. 19 is an equivalent circuit diagram of various elements, wiring lines, and so on in a plurality of pixels formed in a matrix in an image display region of the liquid crystal display device, and FIG. 20 is a partially enlarged sectional view of the liquid crystal display device. In the drawings used for the following description, the scale of each layer or member is adjusted in order to have a recognizable size in the drawings.

As shown in FIGS. 17 and 18, a liquid crystal display device (electro-optical device) 100 according to the present embodiment includes a TFT array substrate 10, a counter substrate 20, which are paired and bonded to each other by a sealant 52 serving as a light-curable end sealant, and liquid crystal 50 sealed and maintained in a region defined by the sealant 52. The sealant 52 has a closed-frame shape in a region of a substrate surface, without a liquid crystal injection port and marks of being sealed by the end sealant.

A peripheral border 53 formed of a light-shielding material is formed in an inner side of a region where the sealant 52 is formed. In a region outside the sealant 52, a data line driving circuit 201 and mounting terminals 202 are formed along one side of the TFT array substrate 10 and scanning line driving circuits 204 are formed along two sides adjacent to the one side. In the one remaining side of the TFT array substrate 10, a plurality of wiring lines 205, which connects the scanning line driving circuits 204 provided at both sides of the image display region, is provided. In addition, conductive members 206 for making an electrical conduction between the TFT array substrate 10 and the counter substrate 20 are disposed in at least one of the corners of the counter substrate 20.

Further, instead of forming the data line driving circuit 201 and the scanning line driving circuits 204 on the TFT array substrate 10, for example, a TAB (Tape Automated Bonding) substrate having a driving LSI mounted thereon may be electrically and mechanically connected to a group of terminals formed in the periphery of the TFT array substrate 10 through an anisotropic conductive film. In addition, the liquid crystal display device 100 may include a retardation film, a polarizer, and so on (not shown) arranged in a predetermined direction, depending on the kind of the liquid crystal 50 used, that is, an operation mode such as a TN (Twisted Nematic) mode or a STN (Super Twisted Nematic) mode, or a normally white mode/normally black mode.

Further, in the case of a liquid crystal display device 100 for color display, for example, red (R), green (G), and blue (B)

color filters are formed together with protective films therefore, in a region of the counter substrate 20 opposite to each pixel electrode, which will be described later, of the TFT array substrate 10.

In the image display region of the liquid crystal display device 100 as constructed above, a plurality of pixels 100*a* are formed in a matrix, the pixels 100*a* include pixel switching TFTs (switching elements) 30, and data lines 6*a* for supplying pixel signals S1, S2, . . . , and Sn are electrically connected to source electrodes of the TFTs 30, respectively, as shown in FIG. 19. The pixel signals S1, S2, . . . and Sn written into the data lines 6*a* may be sequentially supplied in this order, or may be supplied for each of groups of adjacent data lines 6*a*. In addition, scanning lines 3*a* are electrically connected to gate electrodes of the TFTs 30, and scanning signals G1, G2, . . . , and Gm are sequentially applied to the scanning lines 3*a* in this order at a predetermined timing in a pulsed manner.

Pixel electrodes 19 are electrically connected to drain electrodes of the TFTs 30, and by turning on the TFTs 30 serving as the switching elements for a specified period of time, the pixel signals S1, S2, . . . , and Sn supplied from the data lines 6*a* are written into the pixels at a predetermined timing. The pixel signals S1, S2, . . . , and Sn having predetermined levels and written into the liquid crystal through the pixel electrodes 19 are maintained between the pixel electrodes 19 and a counter electrode 121 of the counter substrate 20 shown in FIG. 18 for a predetermined period of time. In additions in order to prevent the maintained pixel signals S1, S2, . . . , and Sn from leaking, storage capacitors 60 are added in parallel to liquid crystal capacitors formed between the pixel electrodes 19 and the counter electrode 121 and are connected to common wiring lines 3*b*. For example, the voltages of the pixel electrodes 19 are maintained by the storage capacitors 60 for a period of time which is 1000 times longer than a period of time for which a source voltage is applied. Accordingly, a storage characteristic of charges is improved, thus realizing a liquid crystal display device 100 having a high contrast ratio.

FIG. 20 is a partially enlarged sectional view of the liquid crystal display device 100 having a bottom-gate-type TFT 30, where a gate wiring line 61 serving as a conductive film is formed on a glass substrate P forming the TFT array substrate 10 by using the above-described film pattern formation method.

On the gate wiring line 61, a semiconductor layer 63 formed of an amorphous silicon (a-Si) layer is stacked with a gate insulating film 62 made of $SiN_x$ interposed therebetween. A portion of the semiconductor layer 63 opposite to the gate wiring line becomes a channel region. Junction layers 64*a* and 64*b* formed of, for example, an $n^+$-type a-Si layer to obtain an ohmic contact, are formed on the semiconductor layer 63, and an insulating etching stopper 65 made of $SiN_x$ to protect a channel is formed on the semiconductor 63 in a central portion of the channel region. In addition, the insulating film 62, the semiconductor layer 63, and the etching stopper 65 are patterned as shown in FIG. 20, by performing resist application, photosensitization·development, and photo-etching processes after performing a deposition (CVD) process.

Furthermore, the junction layers 64*a* and 64*b* and pixel electrode 19 made of ITO are also formed and patterned, as shown in FIG. 20, by performing a photo-etching process. In addition, banks 66 are formed on the pixel electrode 19 so as to protrude therefrom, the gate insulating film 62 and the etching stopper 65, and a source line and a drain line are formed by discharging liquid droplets made of silver compounds between these banks 66 by using the above-described liquid droplet discharging apparatus IJ.

In the liquid crystal display device according to the present embodiment, since a conductive film which is made to be thin or fine by using the above-described film pattern forming method is consistently formed with high precision, it is possible to obtain a liquid crystal display device with high quality and performance.

While it is shown in the present embodiment that the TFT 30 is used as a switching element for driving the liquid crystal display device 100, this configuration can be applied to an organic EL (electroluminescent) display device, for example, in addition to the liquid crystal display device. The organic EL device is a device in which a film containing inorganic and organic fluorescent compounds is interposed between a cathode and an anode, exciton is generated by injecting electrons and holes into the film so as to recombine the electrons and holes, and an image is displayed by using emission of light (fluorescence phosphorescence) when the exciton is deactivated. In addition, a self-emitting full color EL device can be manufactured by patterning ink, which is composed of materials showing red, green, and blue colors, that is, light-emitting layer formation materials, and materials for forming hole injection/electron transport layers, on the substrate having the TFT 30. The scope of device (electro-optical device) in the invention covers the above-described organic EL device.

Figure 21:
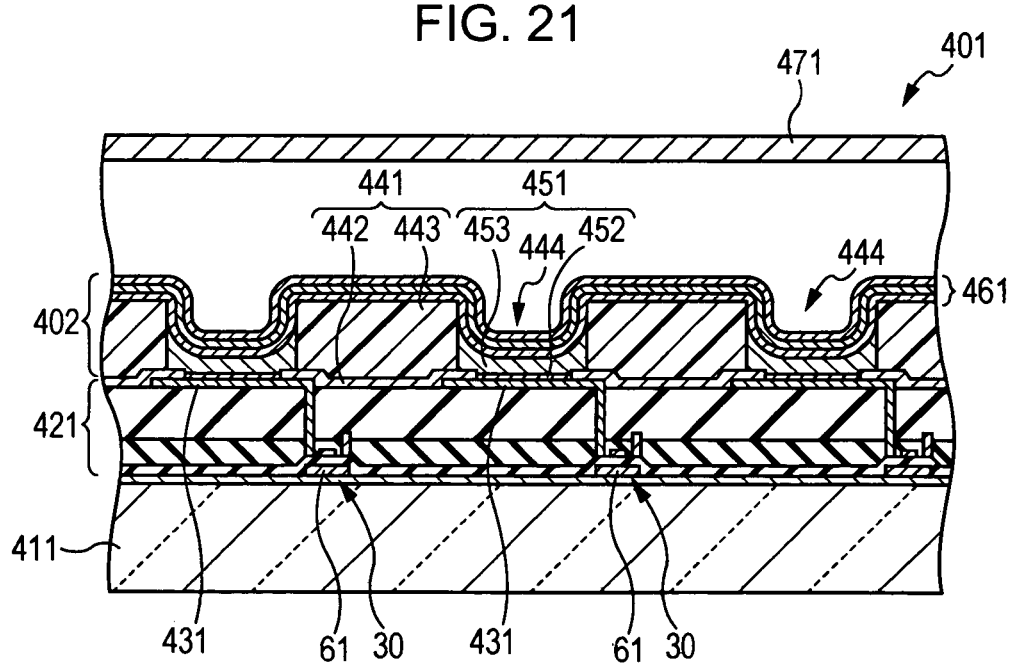
FIG. 21 is a partially enlarged sectional view of an organic EL device.

FIG. 21 is a side sectional view of an organic EL device, in which some components are manufactured by using the liquid droplet discharging apparatus IJ. Now, the schematic configuration of the organic EL device will be described with reference to FIG. 21.

As shown in FIG. 21, an organic EL device 401 includes a substrate 411, a circuit element part 421, an organic EL element 402 composed of pixel electrodes 431, banks 441, light-emitting elements 451, a cathode 461 (counter electrode), and a sealing substrate 471, wiring lines and a driving IC (not shown), which are connected to the organic EL element 402, of a flexible substrate (not shown). Each of the banks 441 is composed of a first bank 442 and a second bank 443. The circuit element part 421 includes TFTS, which are active elements, formed on the substrate 411. A plurality of pixel electrodes 431 are aligned on the circuit element part 421. In addition, the gate wiring lines 61 forming the TFTs 30 are formed by using the wiring pattern forming method described in the above embodiments.

The banks 441 are formed in a matrix between the pixel electrodes 431, and the light-emitting elements 451 are formed in recessed openings 444 generated by the banks 441. Each of the light-emitting elements 451 is composed of a red light-emitting element, a green light-emitting element, and a blue light-emitting element so as to realize full color display of the organic EL device 401. The cathode 461 is formed on the entire upper surfaces of the banks 441 and the light-emitting elements 451, and the sealing substrate 471 is formed on the cathode 461.

A process of manufacturing the organic EL device 401 including the organic EL elements includes a bank forming process of forming the banks 441, a plasma treatment process of properly forming light-emitting elements 451, a light-emitting element forming process of forming the light-emitting elements 451, a counter electrode forming process of forming the cathode 461, and a sealing process of stacking the sealing substrate 471 on the cathode 461 so as to seal the sealing substrate 471.

The light-emitting element forming process is to form the light-emitting elements 451 by forming the hole injection layer 452 and the light-emitting layer 453 on the recessed openings 444, that is, the pixel electrodes 431, and includes a hole injection layer forming process and a light-emitting layer forming process. In addition, the hole injection layer forming process includes a first discharging process of discharging a liquid material for forming the hole injection layer 452 on the pixel electrodes 431 and a first drying process of forming the hole injection layer 452 by drying the discharged liquid material. In addition, the light-emitting layer forming process includes a second discharging process of discharging a liquid material for forming the light-emitting layer 453 on the hole injection layer 452 and a second drying process of forming the light-emitting layer 453 by drying the discharged liquid material. In addition, the three kinds of light-emitting layers 453 are formed depending on the material corresponding to the three red, green, and blue colors, as described above. Accordingly, the second discharging process includes three processes for discharging three kinds of materials.

In the light-emitting element forming process, the liquid droplet discharging apparatus IJ may be used in the first discharging process of the hole injection layer forming process and the second discharging process of the light-emitting layer forming process.

Figure 22:
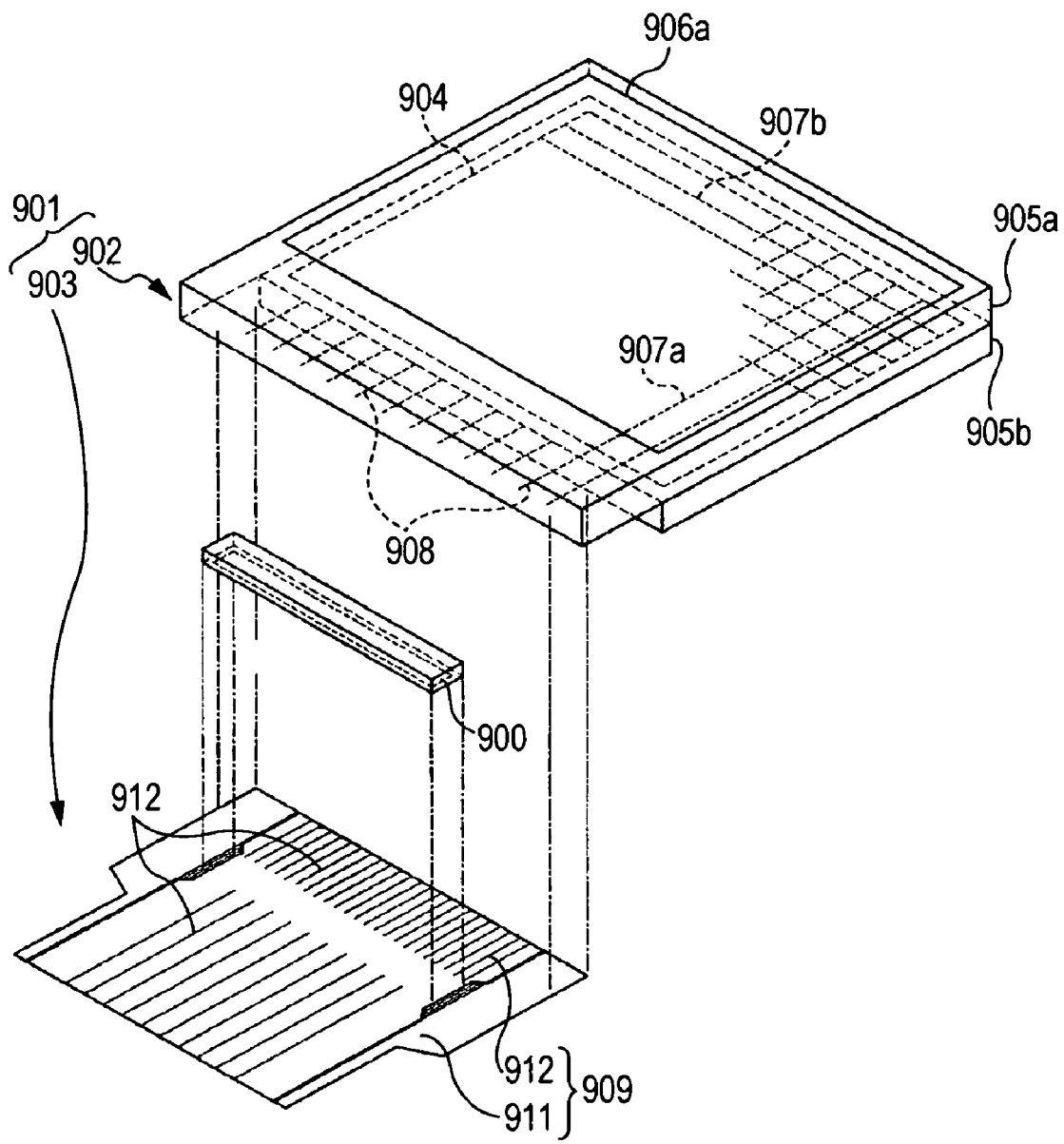
FIG. 22 is a view illustrating another liquid crystal display device.

FIG. 22 is a view illustrating a liquid crystal display device according to another embodiment.

A liquid crystal display device (electro-optical device) 901 shown in FIG. 22 generally includes a color liquid crystal panel (electro-optical panel) 902 and a circuit substrate 903 connected to the liquid crystal panel 902. In addition, if necessary, an illuminator such as a backlight and other subsidiary devices are attached to the liquid crystal panel 902.

The liquid crystal panel 902 includes a pair of substrates 905a and 905b bonded to each other by a sealant 904. In addition, liquid crystal is sealed in a gap, that is, a so-called cell gap, formed between the substrates 905a and 905b. The substrates 905a and 905b are generally formed of a transparent material, for example, glass or synthetic resin. Polarizers 906a and 906b are bonded to outer surfaces of these substrates 905a and 905b. However, the polarizer 906b is not shown in FIG. 22.

Further, an electrode 907a is formed on an inner surface of the substrate 905a and an electrode 907b is formed on an inner surface of the substrate 905b. The electrodes 907a and 907b are formed in the form of stripes, characters, numbers, or other proper patterns. In addition, these electrodes 907a and 907b are formed of a transparent material such as ITO (indium tin oxide). The substrate 905a has an extending portion extending from the substrate 905b. A plurality of terminals 908 is formed on this extending portion. The terminals 908 are formed at the same time when the electrode 907a is formed on the substrate 905a. Accordingly, the terminals 908 are formed of ITO, for example. The terminals 908 include elements integrally extending from the electrode 907a and elements connected to the electrode 907b through conductive members (not shown).

A semiconductor device 900 serving as a liquid crystal driving IC is mounted at a predetermined position on a wiring substrate 909 in the circuit substrate 903. In addition, although not shown, resistors, capacitors, and other chip components may be mounted at predetermined positions other than a position at which the semiconductor device 900 is mounted. The wiring substrate 909 is manufactured by forming a wiring pattern 912 by patterning a metal film, such as Cu, formed on a flexible base substrate 911 such as polyimide.

In the present embodiment, the electrodes 907a and 907b in the liquid crystal panel 902 and the wiring pattern 912 in the circuit substrate 903 are formed by using the above-described device manufacturing method.

According to the liquid crystal display device of the embodiment, it is possible to obtain a liquid crystal display device with high quality and uniform electrical characteristics.

Even though the above-described liquid crystal panel is a passive liquid crystal panel, an active-matrix-type liquid crystal panel may be used. That is, thin film transistors (TFTs) are formed on one substrate, and pixel electrodes are formed to correspond to the respective TFTs. In addition, wiring lines (gate wiring lines and source wiring lines) electrically connected to the TFTs may be formed by using the inkjet technique as described above. On the other hand, a counter electrode and the like is formed on a counter substrate. The invention can be applied to the active-matrix-type liquid crystal panel.

Further, the device (electro-optical device) of the invention can also be applied to a PDP (plasma display panel), or a surface-conduction electron-emitter display using a phenomenon that electrons are emitted when current flows in parallel to a surface of a small-area thin film formed on a substrate.

Electronic Apparatus

Next, specific examples of an electronic apparatus of the invention will be described.

Figure 23A:
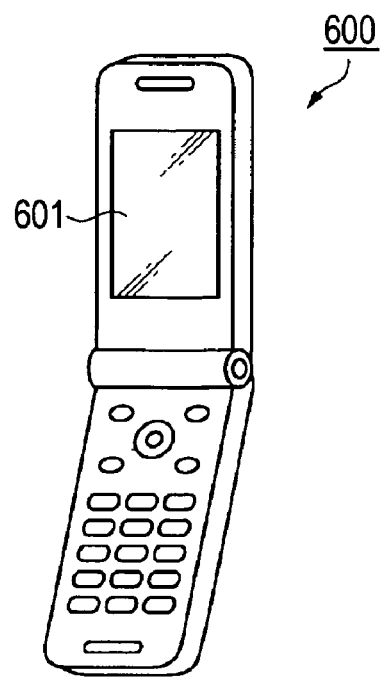
FIGS. 23A to 23C are views illustrating specific examples of an electronic apparatus according to the invention.

FIG. 23A is a perspective view illustrating an example of a mobile phone. In FIG. 23A, reference numeral 600 denotes a mobile phone body, and reference numeral 601 denotes a liquid crystal display unit including the liquid crystal display device described in the above embodiments.

Figure 23B:
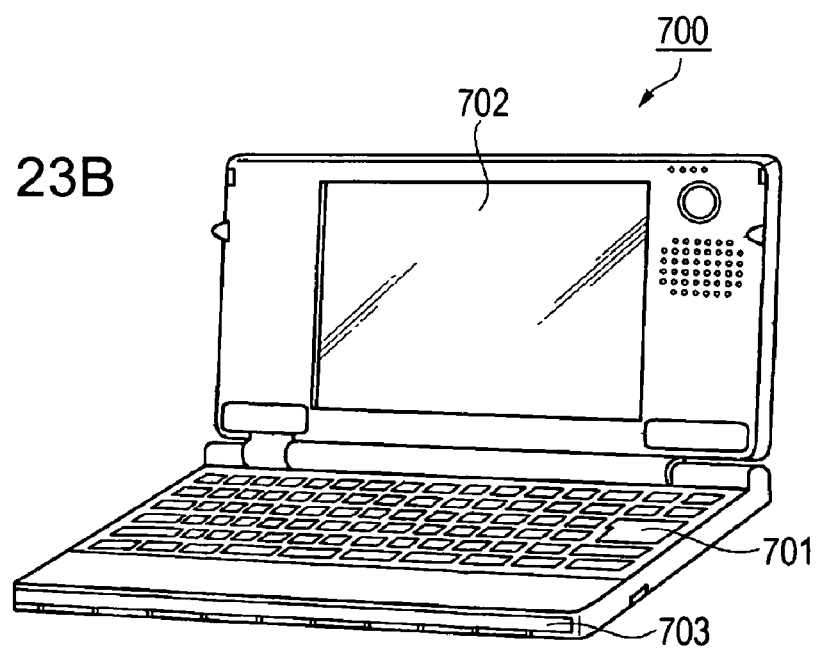

FIG. 23B is a perspective view illustrating an example of a portable information processing apparatus such as a word processor or a personal computer. In FIG. 23B, reference numeral 700 denotes an information processing apparatus, reference numeral 701 denotes an input unit such as a keyboard, reference numeral 703 denotes an information processing apparatus body, and reference numeral 702 denotes a liquid crystal display unit including the liquid crystal display device described in the above embodiments.

Figure 23C:
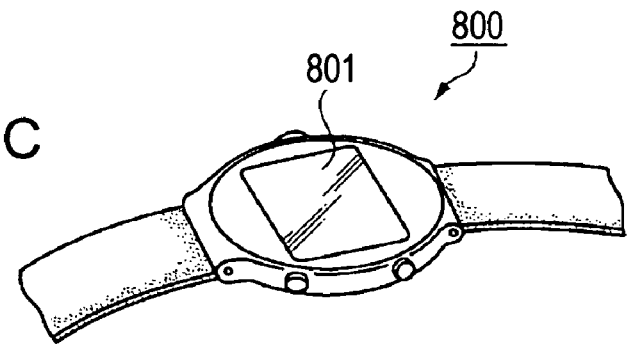

FIG. 23C is a perspective view illustrating an example of an electronic wrist watch. In FIG. 23C, reference numeral 800 denotes a watch body, and reference numeral 801 denotes a liquid crystal display unit including the liquid crystal display device described in the above embodiments.

The electronic apparatuses shown in FIGS. 23A to 23C can have high quality and high performance since the electronic apparatuses use the liquid crystal display device described in the above embodiments.

Even though it is shown in the embodiments that the electronic apparatuses use the liquid crystal display device, the electronic apparatuses may use other electro-optical devices such as organic EL devices or plasma display panels.

Next, an example in which the film pattern formed by the film pattern forming method of the invention is applied to an antenna circuit will be described.

Figure 24:
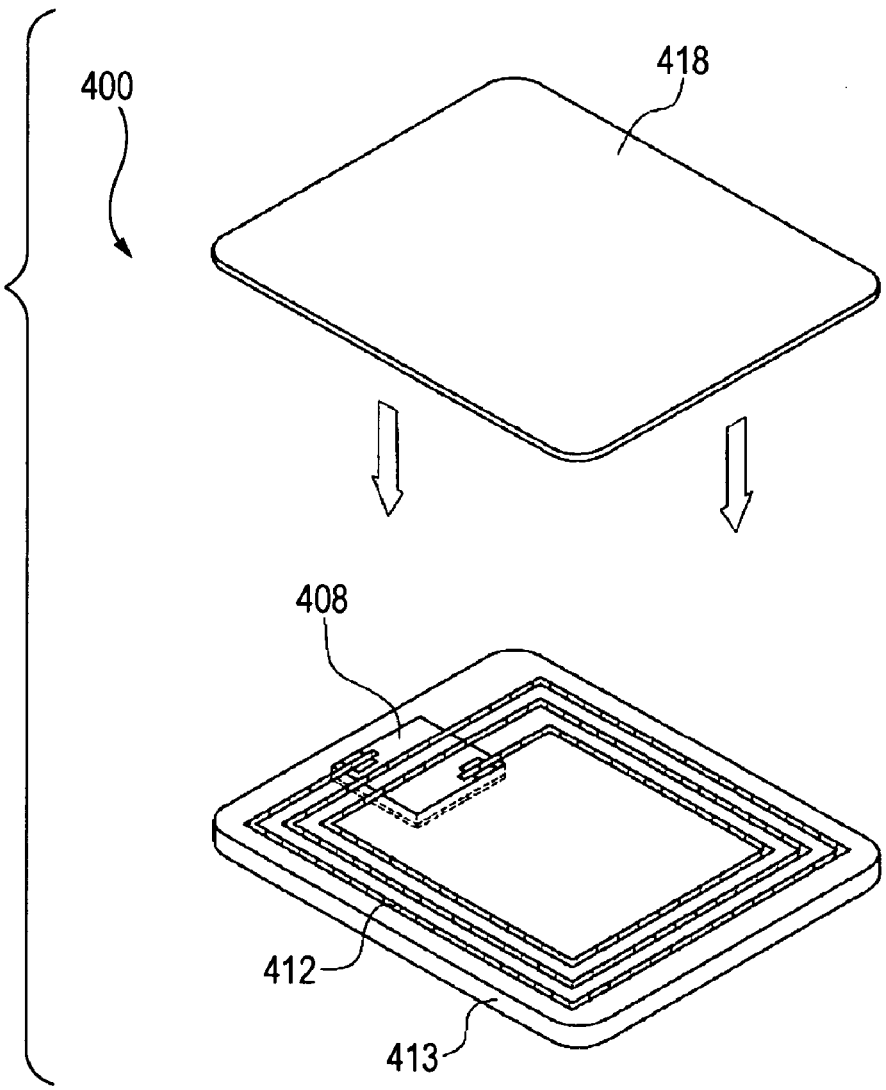
FIG. 24 is an exploded perspective view of a non-contact card medium.

FIG. 24 shows a non-contact card medium according to an embodiment of the invention. A non-contact card medium 400 contains a semiconductor integrated circuit chip 408 and an antenna circuit 412 in a casing composed of a card base 413 and a card cover 418, and performs a power supply operation and at least one of data transmission and reception operations through an external transceiver (not shown) and at least one of electromagnetic waves and electrostatic capacitive coupling.

In the present embodiment, the antenna circuit 412 is formed on the basis of the film pattern forming method of the invention. Accordingly, the antenna circuit 412 can be made to be thin or fine, and it is possible to realize high quality and high performance.

Having described the preferred embodiments of the invention with reference to the accompanying drawings, the invention is not limited thereto. It should be noted that various shapes or combinations of various members or elements described in the embodiments are only illustrative, but the members or elements and combinations thereof may be properly changed in various ways as a design demand without departing from the scope and spirit of the invention.

First Modification

While polysilazane and photosensitive polysilazane containing photoacid generator have been used as the bank formation material in the first embodiment, the invention is not limited thereto, but polysilazane and photosensitive polysilazane containing photobase generator may be used as the bank formation material. The photobase generator is a compound which generates a base by light irradiation. Silanol radical (Si—OH) is generated by efficiently reacting Si—N coupling of polysilazane with water molecules by using the generated base as a catalyst and is dissolved into developer. An example of the photobase generator may include NBC-1 (available from Midori Kagaku Co., Ltd.). An inorganic bank is formed by performing the same processes as in the first embodiment.

According to the first modification, since inorganic banks having high heat-resistance are formed in the form of a positive resist, the film pattern F is formed into a desired shape, in the same manner as in the first and second embodiments.

Second Modification

While polysiloxane and photosensitive polysiloxane containing photoacid generator have been used as the bank formation material in the second embodiment, the invention is not limited thereto, but polysilazane and photosensitive polysilazane containing photobase generator may be used as the bank formation material. Hydro radical (—H) of polysiloxane efficiently generates silanol radical by using a base generated by light irradiation as a catalyst and is dissolved into developer. An inorganic bank is formed by performing the same processes as the second embodiment.

According to the second modification, since inorganic banks having high heat-resistance are formed in the form of a positive resist, the film pattern F is formed into a desired shape, in the same manner as in the first and second embodiments.

Third Modification

While polysiloxane and photosensitive polysiloxane containing photoacid generator have been used as the bank formation material in the second embodiment, the invention is not limited thereto, but polysilane and photosensitive polysilane containing photoacid generator may be used as the bank formation material. The hydro radical of polysilane efficiently generates silanol radical by using an acid generated by light irradiation as the catalyst and is dissolved into developer. An inorganic bank is formed by performing the same processes as in the second embodiment.

According to the third modification, since inorganic banks having high heat-resistance are formed in the form of a positive resist, the film pattern F is formed into a desired shape, in the same manner as in the first and second embodiments.

Fourth Modification

While polysiloxane and photosensitive polysiloxane containing photoacid generator have been used as the bank formation material in the second embodiment, the invention is not limited thereto, but polysilane and photosensitive polysilane containing photobase generator may be used as the bank formation material. Hydro radical of polysilane efficiently generates silanol radical by using a base generated by light irradiation as a catalyst and is dissolved into developer. An inorganic bank is formed by performing the same processes as in the second embodiment.

According to the fourth modification, since inorganic banks having high heat-resistance are formed in the form of a positive resist, the film pattern F is formed into a desired shape, in the same manner as in the first and second embodiments.

Fifth Modification

While polysiloxane and photosensitive polysiloxane containing photoacid generator have been used as the bank formation material in the second embodiment, the invention is not limited thereto, but a material which contains only polysilane but does not contain photoacid generator may be used as the bank formation material. Since polysilane compound absorbs light by light irradiation and a main chain of polysilane compound is resolved, the polysilane compound is dissolved into developer. An inorganic bank is formed by performing the same processes as in the second embodiment.

Further, the light irradiated in the first exposure process S3 may be electromagnetic waves such as electron ray, gamma ray, X ray, or ultraviolet ray.

According to the fifth modification, since inorganic banks having high heat-resistance are formed in the form of a positive resist, the film pattern F is formed into a desired shape, in the same manner as in the first and second embodiments. In addition, since the bank formation material requires no photoacid generator, the consumption of resources can be reduced.

Sixth Modification

While polysilazane and photosensitive polysilazane containing photoacid generator have been used as the bank formation material in the first embodiment, the invention is not limited thereto, but photosensitive polysilazane, which is polysilazane containing a radical (hereinafter, referred to as 'photoacid generator') which reacts with light so as to generate an acid, may be used as the bank formation material. An example of the photoacid generator may include —Ar1-$SO_2$—$CH_2CO$—Ar2 (Ar1 and Ar2 represent aryl or substituted aryl). An inorganic bank is formed by performing the same processes as in the first embodiment.

According to the sixth modification, in addition to the effect of the first embodiment, since the bank formation material requires no photoacid generator, bank formation materials are simply combined, thus improving productivity.

Seventh Modification

While polysiloxane and photosensitive polysiloxane containing photoacid generator have been used as the bank formation material in the second embodiment, the invention is not limited thereto, but photosensitive polysiloxane, which is polysiloxane containing photoacid generator, may be used as the bank formation material. An inorganic bank is formed by performing the same processes as in the second embodiment.

According to the seventh modification, in addition to the effect of the second embodiment, since the bank formation material requires no photoacid generator, bank formation materials are simply combined, thus improving productivity.

Eighth Modification

While polysilazane and photosensitive polysilazane containing photobase generator have been used as the bank formation material in the first modification, the invention is not limited thereto, but photosensitive polysilazane, which is polysilazane containing a radical (hereinafter, referred to as 'photobase generator') which reacts with light so as to generate a base, may be used as the bank formation material. An example of the photobase generator may include O-acryloylacetphenoneoxime-O, O-acryloylacetnaphthoneoxime-O, etc. An inorganic bank is formed by performing the same processes as in the first modification.

According to the eighth modification, in addition to the effect of the first modification, since the bank formation material requires no photobase generator, bank formation materials are simply combined, thus improving productivity.

Ninth Modification

While polysiloxane and photosensitive polysiloxane containing photobase generator have been used as the bank formation material in the second modification, the invention is not limited thereto, but photosensitive polysiloxane, which is polysiloxane containing photobase generator, may be used as the bank formation material. An inorganic bank is formed by performing the same processes as in the second modification.

According to the ninth modification, in addition to the effect of the second modification, since the bank formation material requires no photoacid generator, bank formation materials are simply combined, thus improving productivity.

Tenth Modification

While polysilane and photosensitive polysilane containing photoacid generator have been used as the bank formation material in the third modification, the invention is not limited thereto, but photosensitive polysilane, which is polysilane containing photoacid generator, may be used as the bank formation material. An inorganic bank is formed by performing the same processes as in the third modification.

According to the tenth modification, in addition to the effect of the third modification, since the bank formation material requires no photoacid generator, bank formation materials are simply combined, thus improving productivity.

Eleventh Modification

While polysilane and photosensitive polysilane containing photobase generator have been used as the bank formation material in the fourth modification, the invention is not limited thereto, but photosensitive polysilane, which is polysilane containing photobase generator, may be used as the bank formation material. An inorganic bank is formed by performing the same processes as in the fourth modification.

According to eleventh modification, in addition to the effect of the fourth modification, since the bank formation material requires no photobase generator, bank formation materials are simply combined, thus improving productivity.

Twelfth Modification

While the liquid droplets of the liquid material are stacked several times by repeating the material disposition process and the intermediate drying process and then are sintered in the baking process in the first embodiment, the invention is not limited thereto, but the liquid droplets may be sintered in the baking process after the material disposition process. In addition, by repeating the material disposition process and the baking process several times, a plurality of layers where baked liquid droplets of the liquid material are stacked may be formed.

Thirteenth Modification

Figure 25:
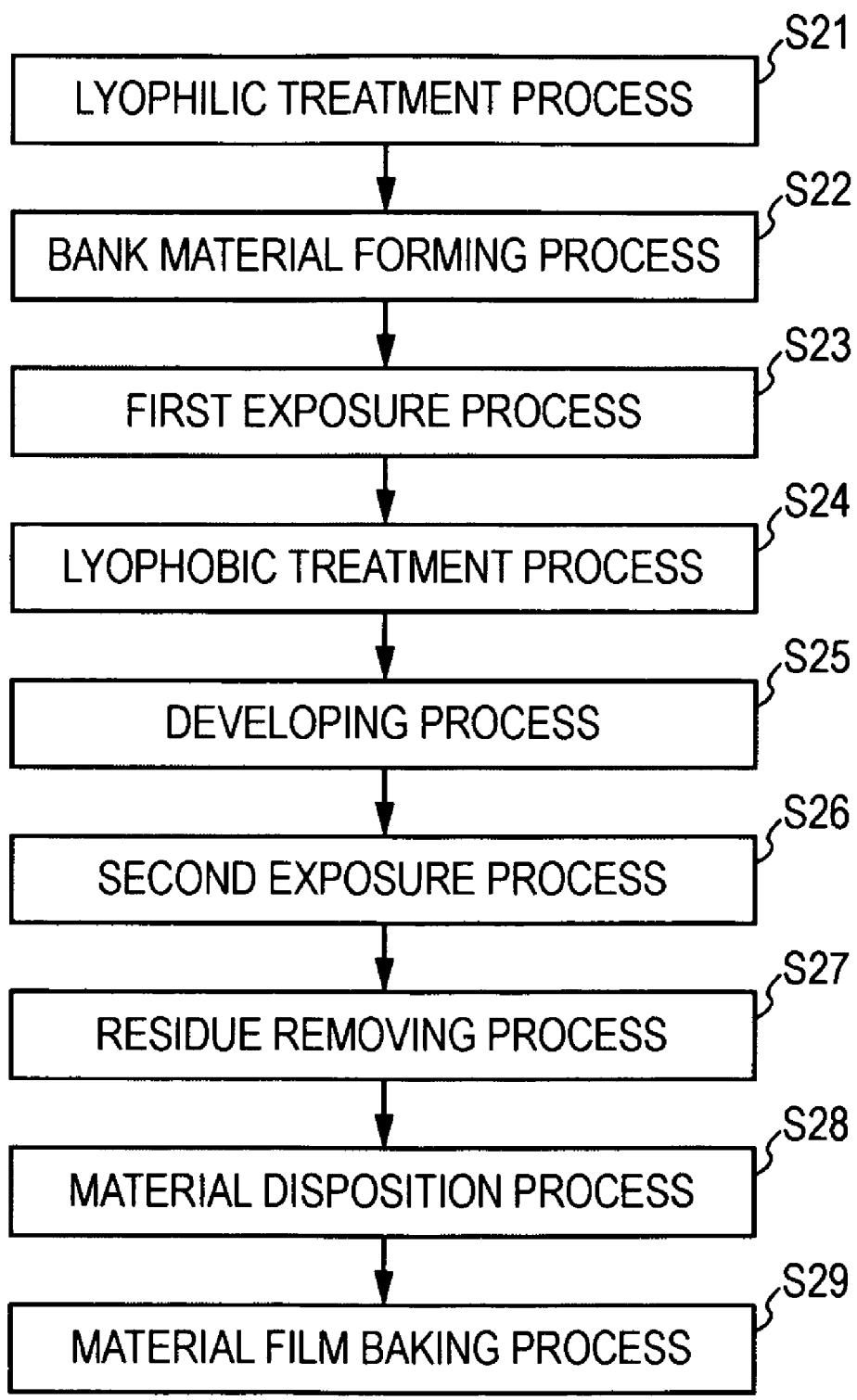
FIG. 25 is a flow chart illustrating a method of forming a film pattern according to a thirteenth modification.

While the bank baking process S7 has been performed after the second exposure process S6 in the first embodiment, the bank baking process S7 may be omitted. As shown in FIG. 25, after the second exposure process S26, the banks and the material film may be simultaneously baked in the material film baking process S29 subsequent to the material disposition process S28, without performing the bank baking process. In this manner, by reducing the number of processes, the productivity may be improved.

What is claimed is:

1. A method of forming a film pattern by disposing functional liquid on a substrate, comprising:
   forming a plurality of banks on the substrate, adjacent banks beings separated by a trench having a plurality of first portions including a first width that are each connected by a plurality of second portions having a second width, the second width being greater than the first width and a transition region between the first portions and the second portions being hexagonal in shape when viewed in plan;
   disposing the functional liquid in the trench partitioned by the banks; and
   drying the functional liquid disposed on the substrate,
   wherein the forming of the banks includes:
      forming a thin film on the substrate, the thin film being made of a material for forming the banks;
      after forming the thin film on the substrate, performing lyophobic treatment on a surface of the thin film; and
      after performing the lyophobic treatment on a surface of the thin film, patterning the thin film into the shapes of the banks.

2. The method according to claim 1,
   wherein the forming of the banks includes performing exposure treatment on the thin film before performing the lyophobic treatment on the surface of the thin film.

3. The method according to claim 1,
   wherein the material for forming the banks contains one of polysilazane, polysilane, and polysiloxane.

4. The method according to claim 3,
   wherein the material for forming the banks comprises a photosensitive material containing one of polysilazane, polysilane, and polysiloxane.

5. The method according to claim 1,
   wherein the functional liquid is disposed in the regions by using a liquid droplet discharging method.

6. The method according to claim 5,
   wherein each of the regions partitioned by the banks includes first and second portions, the first portion being wider than the second portion.

7. A method of manufacturing a device having a film pattern formed on a substrate,
   wherein the film pattern is formed on the substrate by using the method of forming the film pattern according to claim 1.

8. The method according to claim 7,
   wherein the film pattern forms a portion of a switching element provided on the substrate.

9. The method according to claim 8,
   wherein the film pattern forms at least a portion of at least one of a gate wiring line and a gate electrode of the switching element provided on the substrate.

10. A device manufactured by using the method of manufacturing the device according to claim 7.

11. An electro-optical device comprising the device according to claim 10.

12. An electronic apparatus comprising the electro-optical device according to claim 11.

* * * * *